(12) United States Patent
Lee

(10) Patent No.: US 12,073,894 B2
(45) Date of Patent: Aug. 27, 2024

(54) SEMICONDUCTOR MEMORY DEVICE AND OPERATING METHOD OF THE SEMICONDUCTOR MEMORY DEVICE

(71) Applicant: SK hynix Inc., Icheon-si Gyeonggi-do (KR)

(72) Inventor: Hee Youl Lee, Icheon-si Gyeonggi-do (KR)

(73) Assignee: SK hynix Inc., Icheon-si Gyeonggi-do (KR)

(*) Notice: Subject to any disclaimer, the term of this patent is extended or adjusted under 35 U.S.C. 154(b) by 185 days.

(21) Appl. No.: 17/665,300

(22) Filed: Feb. 4, 2022

(65) Prior Publication Data

US 2023/0070166 A1 Mar. 9, 2023

(30) Foreign Application Priority Data

Sep. 9, 2021 (KR) .................. 10-2021-0120307

(51) Int. Cl.
| | | |
|---|---|---|
| *G11C 16/10* | (2006.01) | |
| *G11C 16/08* | (2006.01) | |
| *G11C 16/24* | (2006.01) | |
| *G11C 16/26* | (2006.01) | |
| *G11C 16/30* | (2006.01) | |
| *G11C 16/34* | (2006.01) | |

(52) U.S. Cl.
CPC .......... *G11C 16/3459* (2013.01); *G11C 16/08* (2013.01); *G11C 16/102* (2013.01); *G11C 16/24* (2013.01); *G11C 16/26* (2013.01); *G11C 16/30* (2013.01); *G11C 16/3404* (2013.01)

(58) Field of Classification Search
CPC ... G11C 16/3459; G11C 16/08; G11C 16/102; G11C 16/24; G11C 16/26; G11C 16/30; G11C 16/3404
See application file for complete search history.

(56) References Cited

U.S. PATENT DOCUMENTS

| | | | | |
|---|---|---|---|---|
| 2017/0110185 A1* | 4/2017 | Hahn | ............... | G11C 11/5642 |
| 2020/0211663 A1* | 7/2020 | Baraskar | ........... | G11C 11/5642 |
| 2020/0234768 A1* | 7/2020 | Lin | .................. | G11C 16/10 |
| 2021/0406107 A1* | 12/2021 | Banerjee | ............ | G06F 11/0793 |
| 2022/0230685 A1* | 7/2022 | Alrod | ................... | H10B 41/27 |
| 2022/0406398 A1* | 12/2022 | Yang | ................ | G11C 16/102 |

FOREIGN PATENT DOCUMENTS

| | | | |
|---|---|---|---|
| KR | 100836762 B1 | 6/2008 | |
| KR | 100866954 B1 | 11/2008 | |

* cited by examiner

*Primary Examiner* — Min Huang
(74) *Attorney, Agent, or Firm* — WILLIAM PARK & ASSOCIATES LTD.

(57) ABSTRACT

A method of operating a semiconductor memory device programming selected memory cells to store bits of data in each of the selected memory cells includes foggy programming and fine programming.

20 Claims, 28 Drawing Sheets

SEMICONDUCTOR MEMORY DEVICE AND OPERATING METHOD OF THE SEMICONDUCTOR MEMORY DEVICE

CROSS-REFERENCE TO RELATED APPLICATION

The present application claims priority under 35 U.S.C. § 119(a) to Korean patent application number 10-2021-0120307 filed on Sep. 9, 2021, in the Korean Intellectual Property Office, the entire disclosure of which is incorporated by reference herein.

BACKGROUND

1. Technical Field

Various embodiments relate generally to an electronic device, and more particularly, to semiconductor memory device and an operating method of the semiconductor memory device.

2. Related Art

A semiconductor memory device may have a two-dimensional structure in which strings are arranged in a horizontal direction to a semiconductor substrate, or a three-dimensional structure in which strings are arranged in a vertical direction to the semiconductor substrate. A three-dimensional memory device is devised to overcome the limited degree of integration in a two-dimensional memory device, and may include a plurality of memory cells vertically stacked on a semiconductor substrate. A controller may control operations of a semiconductor memory device.

SUMMARY

According to an embodiment of the present disclosure, a method of operating a semiconductor memory device programming selected memory cells to store N bits of data in each of the selected memory cells may include foggy programming for increasing threshold voltages of first memory cells to be programmed to $(2^{N-1})$th to $(2^N-1)$th target program states, among first to $(2^N-1)$th target program states, to an intermediate program state by using an intermediate verify voltage, and fine programming for programming the selected memory cells to target program states by using first to $(2^N-1)$th verify voltages, wherein the fine programming comprises increasing the threshold voltages of the first memory cells to be programmed to the $(2^{N-1})$th to $(2^N-1)$th target program states and increasing threshold voltages of second memory cells to be programmed to the first to $(2^{N-1}-1)$th target program states (where N is a natural number).

According to an embodiment of the present disclosure, a method of operating a semiconductor memory device programming selected memory cells to store N bits of data in each of the selected memory cells may include foggy programming for increasing threshold voltages of first memory cells to be programmed to $(2^{N-1})$th to $(2^N-1)$th target program states, among first to $(2^N-1)$th target program states, to an intermediate program state by using an intermediate verify voltage, and fine programming for programming the selected memory cells to target program states by using first to $(2^N-1)$th verify voltages, wherein the fine programming comprises increasing the threshold voltages of second memory cells to be programmed to the first to $(2^{N-1}-1)$th target program states and increasing threshold voltages of the first memory cells to be programmed to the $(2^{N-1})$ to $(2^N-1)$th target program states (where N is a natural number).

According to an embodiment of the present disclosure, a method of operating a semiconductor memory device programming selected memory cells to store N bits of data in each of the selected memory cells may include first foggy programming for increasing threshold voltages of first memory cells to be programmed to $(2^{N-1})$th to $(2^N-1)$th target program states, among first to $(2^N-1)$th target program states, to a first intermediate program state by using an intermediate verify voltage, second foggy programming for increasing the threshold voltages of the first memory cells to be programmed to the $(2^{N-1})$th to $(2^N-1)$th target program states from the first intermediate program state to a second intermediate program state by using a $(2^N-1)$th verify voltage greater than the intermediate verify voltage, and fine programming for programming the selected memory cells to target program states (where N is a natural number).

DETAILED DESCRIPTION

Figure 1:
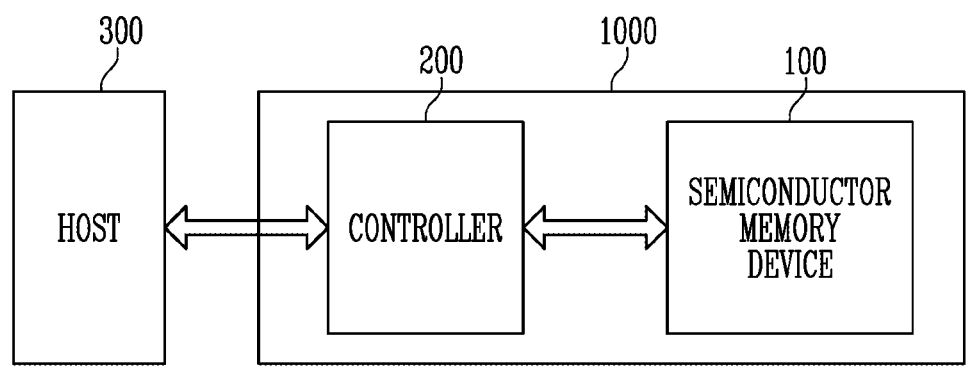
FIG. 1 is a block diagram illustrating a memory system including a semiconductor memory device and a controller according to an embodiment of the present disclosure.

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various embodiments are directed to a semiconductor memory device capable of improving data reliability and an operating method thereof.

In an embodiment, the intermediate verify voltage may be smaller than the $(2^{N-1})$th verify voltage.

In an embodiment, the foggy programming may include applying a program inhibition voltage to bit lines coupled to memory cells programmed to the intermediate program state, applying a program permission voltage to bit lines coupled to memory cells not completely programmed among memory cells to be programmed to the intermediate program state, applying a program voltage to a word line coupled to the selected memory cells, and performing a verify operation on the memory cells to be programmed to the intermediate program state by using the intermediate verify voltage.

In an embodiment, the fine programming may include increasing the threshold voltages of the memory cells to be programmed to the $(2^{N-1})$th to $(2^N-1)$th target program states by using the $(2^{N-1})$th to $(2^N-1)$th verify voltages, and increasing the threshold voltages of the memory cells to be programmed to the first to $(2^{N-1}-1)$th target program states by using the first to $(2^{N-1}-1)$th verify voltages.

In an embodiment, the increasing of the threshold voltages of the memory cells to be programmed to the $(2^{N-1})$th to $(2^N-1)$th target program states may include applying a program inhibition voltage to bit lines coupled to memory cells completely programmed to corresponding target program states and memory cells corresponding to the first to $(2^{N-1}-1)$th target program states among the selected memory cells, applying a program permission voltage to bit lines coupled to memory cells not completely programmed among memory cells corresponding to the $(2^{N-1})$th to $(2^N-1)$th target program states, applying a program voltage to a word line coupled to the selected memory cells, and performing a verify operation on the memory cells to be programmed to the $(2^{N-1})$th to $(2^N-1)$th target program states by using the $(2^{N-1})$th to $(2^N-1)$th verify voltages.

In an embodiment, the increasing of the threshold voltages of the memory cells to be programmed to the first to $(2^{N-1}-1)$th target program states may include applying a program inhibition voltage to bit lines coupled to memory cells completely programmed to corresponding target program states and memory cells corresponding to the $(2^{N-1})$th to $(2^N-1)$th target program states among the selected memory cells, applying a program permission voltage to bit lines coupled to memory cells not completely programmed among memory cells corresponding to the first to $(2^{N-1}-1)$th target program states, applying a program voltage to a word line coupled to the selected memory cells, and performing a verify operation on the memory cells to be programmed to the first to $(2^{N-1}-1)$th target program states by using the first to $(2^{N-1}-1)$th verify voltages.

In an embodiment, the fine programming may include applying a program inhibition voltage to bit lines coupled to memory cells completely programmed to corresponding target program states and memory cells corresponding to the first to $(2^{N-1}-1)$th target program states among the selected memory cells, applying a program permission voltage to bit lines coupled to memory cells not completely programmed among memory cells corresponding to the $(2^{N-1})$th to $(2^N-1)$th target program states, applying a first program voltage to a word line coupled to the selected memory cells, applying a program inhibition voltage to bit lines coupled to memory cells completely programmed to corresponding target program states and memory cells corresponding to the $(2^{N-1})$th to $(2^N-1)$th target program states among the selected memory cells, applying a program permission voltage to bit lines coupled to memory cells not completely programmed among the memory cells corresponding to the first to $(2^{N-1}-1)$th target program states, applying a second program voltage smaller than the first program voltage to the word line coupled to the selected memory cells, and performing a verify operation on the selected memory cells by using the first to $(2^N-1)$th verify voltages.

In an embodiment, the fine programming may include applying a program inhibition voltage to bit lines coupled to memory cells completely programmed to corresponding target program states and memory cells corresponding to the first to $(2^{N-1}-1)$th target program states among the selected memory cells, applying a program permission voltage to bit lines coupled to memory cells not completely programmed among memory cells corresponding to the $(2^{N-1})$th to $(2^N-1)$th target program states, applying a first program voltage to a word line coupled to the selected memory cells, applying a program inhibition voltage to bit lines coupled to memory cells completely programmed among the selected memory cells, applying a program permission voltage to bit lines coupled to memory cells not completely programmed among the selected memory cells, applying a second program voltage smaller than the first program voltage to the word line coupled to the selected memory cells, and performing a verify operation on the selected memory cells by using the first to $(2^{N-1})$th verify voltages. In an embodiment, N may be 3.

In an embodiment, the fine programming may include applying a program inhibition voltage to bit lines coupled to memory cells completely programmed to corresponding target program states and memory cells corresponding to the $(2^{N-1})$th to $(2^N-1)$th target program states among the selected memory cells, applying a program permission voltage to bit lines coupled to memory cells not completely programmed among memory cells corresponding to the first to $(2^{N-1}-1)$th target program states, applying a first program voltage to a word line coupled to the selected memory cells, applying a program inhibition voltage to bit lines coupled to memory cells completely programmed to corresponding target program states and the memory cells corresponding to the first to $(2^{N-1}-1)$th target program states among the selected memory cells, applying a program permission voltage to bit lines coupled to memory cells not completely programmed among memory cells corresponding to the $(2^{N-1})$th to $(2^N-1)$th target program states, applying a second program voltage greater than the first program voltage to the word line coupled to the selected memory cells, and performing a verify operation on the selected memory cells by using the first to $(2^N-1)$th verify voltages.

In an embodiment, the fine programming may include applying a program inhibition voltage to bit lines coupled to memory cells completely programmed among the selected memory cells, applying a program permission voltage to bit lines coupled to memory cells not completely programmed among the selected memory cells, applying a first program voltage to a word line coupled to the selected memory cells, applying a program inhibition voltage to bit lines coupled to memory cells completely programmed to corresponding target program states and memory cells corresponding to the first to $(2^{N-1}-1)$th target program states among the selected memory cells, applying a program permission voltage to bit lines coupled to memory cells not completely programmed among memory cells corresponding to the $(2^{N-1})$th to $(2^N-1)$th target program states, applying a second program voltage greater than the first program voltage to the word line coupled to the selected memory cells, and performing a verify operation on the selected memory cells by using the first to $(2^N-1)$th verify voltages.

In an embodiment, the first foggy programming may include applying a program inhibition voltage to bit lines coupled to memory cells programmed to the first intermediate program state, applying a program permission voltage to bit lines coupled to memory cells not completely programmed among memory cells to be programmed to the first intermediate program state, applying a program voltage to a word line coupled to the selected memory cells, and performing a verify operation on the memory cells to be programmed to the first intermediate program state by using the intermediate verify voltage.

In an embodiment, the second foggy programming may include applying the program inhibition voltage to bit lines coupled to memory cells completely programmed to corresponding target program states and memory cells corresponding to the first to $(2^{N-1}-1)$th target program states among the selected memory cells, applying the program permission voltage to bit lines coupled to memory cells not completely programmed among the memory cells corresponding to the $(2^{N-1})$th to $(2^N-1)$th target program states, applying a program voltage to a word line coupled to the selected memory cells, and performing a verify operation on the memory cells to be programmed to the $(2^{N-1})$th to $(2^N-1)$th target program states by using the $(2^{N-1})$th to $(2^N-1)$th verify voltages.

In an embodiment, the second foggy programming may further include, after performing the verify operation, determining whether threshold voltages of all memory cells corresponding to the $(2^{N-1})$th to $(2^N-1)$th target program states are greater than the $(2^{N-1})$th verify voltage.

In an embodiment, the second foggy programming may end in response to determination that threshold voltages of all memory cells corresponding to the $(2^{N-1})$th to $(2^N-1)$th target program states are greater than the $(2^{N-1})$th verify voltage.

In an embodiment, in response to determination that at least one of the threshold voltages of the memory cells corresponding to the $(2^{N-1})$th to $(2^N-1)$th target program states is smaller than the $(2^{N-1})$th verify voltage, the second foggy programming may re-perform applying the program inhibition voltage to the bit lines coupled to the memory cells completely programmed to the corresponding target program states and the memory cells corresponding to the first to $(2^{N-1}-1)$th target program states among the selected memory cells, applying the program permission voltage to the bit lines coupled to the memory cells not completely programmed among the memory cells corresponding to the $(2^{N-1})$th to $(2^N-1)$th target program states, applying the program voltage to the word line coupled to the selected memory cells, and performing the verify operation on the memory cells to be programmed to the $(2^{N-1})$th to $(2^N1)$th target program states by using the $(2^{N-1})$th to $(2^N-1)$th verify voltages.

In an embodiment, the fine programming may include applying a program inhibition voltage to bit lines coupled to memory cells completely programmed to corresponding target program states among the selected memory cells, applying a program permission voltage to bit lines coupled to memory cells not completely programmed to the corresponding target program states among the selected memory cells, applying a program voltage to a word line coupled to the selected memory cells, and performing a verify operation on the selected memory cells by using the first to $(2^N-1)$th verify voltages.

In an embodiment, the intermediate verify voltage may be smaller than the $(2^{N-1})$th verify voltage.

FIG. 1 is a block diagram illustrating a memory system 1000 including a semiconductor memory device 100 and a controller 200 according to an embodiment of the present disclosure.

Referring to FIG. 1, the memory system 1000 may include the semiconductor memory device 100 and the controller 200. In addition, the memory system 1000 may communicate with a host 300. The controller 200 may control the general operation of the semiconductor memory device 100. In addition, the controller 200 may control the operations of the semiconductor memory device 100 based on a command received from the host 300.

Figure 2:
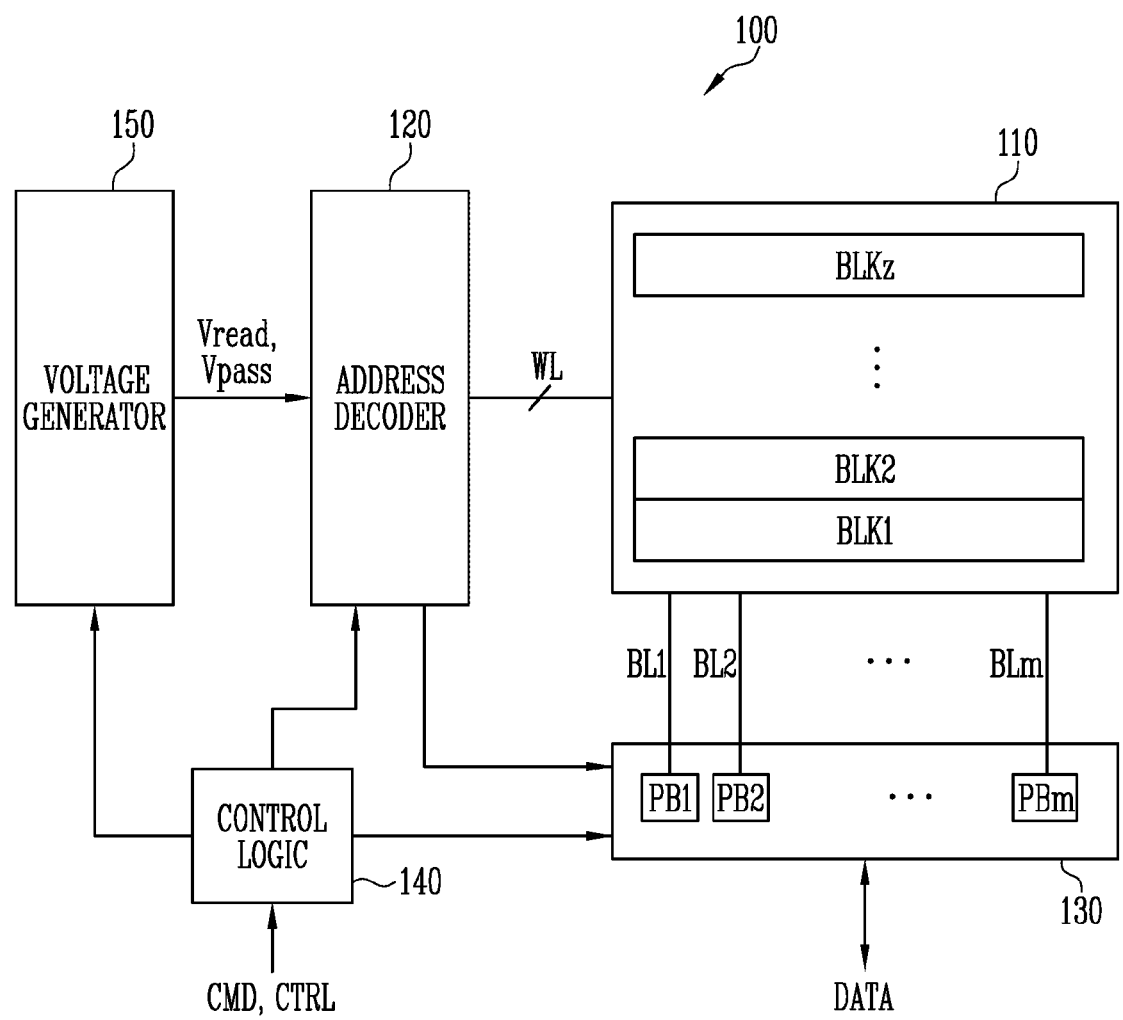
FIG. 2 is a block diagram illustrating a semiconductor memory device shown in FIG. 1.

FIG. 2 is a block diagram illustrating the semiconductor memory device 100 shown in FIG. 1.

Referring to FIG. 2, the semiconductor memory device 100 may include a memory cell array 110, an address decoder 120, a read and write circuit 130, control logic 140, and a voltage generator 150. The control logic 140 may be implemented as hardware, software, or a combination of hardware and software. For example, the control logic 140 may be a control logic circuit operating in accordance with an algorithm and/or a processor executing control logic code.

The memory cell array 110 may include a plurality of memory blocks BLK1 to BLKz. The plurality of memory blocks BLK1 to BLKz may be coupled to the address decoder 120 through word lines WL. The plurality of memory blocks BLK1 to BLKz may be coupled to the read and write circuit 130 through bit lines BL1 to BLm. Each of the plurality of memory blocks BLK1 to BLKz may include a plurality of memory cells. According to an embodiment, the plurality of memory cells may be non volatile memory cells which have a vertical channel structure. The memory cell array 110 may have a two-dimensional structure. According to an embodiment, the memory cell array 110 may have a three-dimensional structure. Each of a plurality of memory cells included in the memory cell array 110 may store at least one bit of data (i.e., DATA). According to an embodiment, each of the plurality of memory cells included in the memory cell array 110 may be a single-level cell (SLC) storing 1-bit data. According to another embodiment, each of the plurality of memory cells included in the memory cell array 110 may be a multi-level cell (MLC) storing 2-bit data. According to another embodiment, each of the plurality of memory cells included in the memory cell array 110 may be a triple-level cell (TLC) storing 3-bit data. According to another embodiment, each of the plurality of memory cells included in the memory cell array 110 may be a quad-level cell (QLC) storing 4-bit data. According to an embodiment, each of the plurality of memory cells included in the memory cell array 110 may store five or more bits of data.

The address decoder 120, the read and write circuit 130 and the voltage generator 150 may operate as peripheral circuits configured to drive the memory cell array 110. The address decoder 120 may be coupled to the memory cell array 110 through the word lines WL. The address decoder 120 may be controlled by the control logic 140. The address decoder 120 may receive an address through an input/output buffer (not illustrated) in the semiconductor memory device 100.

The address decoder 120 may be configured to decode a block address of the received address. The address decoder 120 may select at least one memory block according to the decoded block address. In addition, during a read voltage applying operation in a read operation, the address decoder 120 may apply a read voltage Vread generated by the voltage generator 150 to a selected word line of a selected memory block and may apply a pass voltage Vpass to unselected word lines. In addition, during a program verify operation, the address decoder 120 may apply a verify voltage generated by the voltage generator 150 to the selected word line of the selected memory block, and may apply the pass voltage Vpass to unselected word lines.

The address decoder 120 may be configured to decode a column address of the received address. The address decoder 120 may transfer the decoded column address to the read and write circuit 130.

A read operation and a program operation of the semiconductor memory device 100 may be performed in units of pages. An address which is received at the request of a read operation and a program operation may include a block address, a row address, and a column address. The address decoder 120 may select one memory block and one word line in response to the block address and the row address. The column address may be decoded by the address decoder 120 and provided to the read and write circuit 130.

The address decoder 120 may include a block decoder, a row decoder, a column decoder, and an address buffer.

The read and write circuit 130 may include a plurality of page buffers PB1 to PBm. The read and write circuit 130 may operate as a read circuit during a read operation of the memory cell array 110 and a write circuit during a write operation thereof. The page buffers PB1 to PBm may be coupled to the memory cell array 110 through the bit lines BL1 to BLm. The page buffers PB1 to PBm may continuously supply a sensing current to bit lines coupled to memory cells in order to sense threshold voltages of memory cells and sense changes in amount of current caused by program states of memory cells corresponding thereto through a sensing node to latch sensing data during a read operation and a program verify operation. The read and write circuit 130 may operate in response to page buffer control signals output from the control logic 140.

The read and write circuit 130 may sense data of a memory cell, temporarily store the read data, and output data DATA to the input/output buffer (not illustrated) of the semiconductor memory device 100 during a read operation. According to an embodiment, the read and write circuit 130 may include a column selector in addition to the page buffers (or page registers).

The control logic 140 may be coupled to the address decoder 120, the read and write circuit 130, and the voltage generator 150. The control logic 140 may receive a command CMD and a control signal CTRL through the input/output buffer (not illustrated) of the semiconductor memory device 100. The control logic 140 may be configured to control general operations of the semiconductor memory device 100 in response to the control signal CTRL. In addition, the control logic 140 may output a control signal to control sensing node precharge potential levels of the page buffers PB1 to PBm. The control logic 140 may control the read and write circuit 130 to perform a read operation of the memory cell array 110.

The voltage generator 150 may generate the read voltage Vread and the pass voltage Vpass in response to a control signal output from the control logic 140 during a read operation. The voltage generator 150 may include a plurality of pumping capacitors receiving an internal power voltage to generate a plurality of voltages having various voltage levels, and may generate a plurality of voltages by selectively activating the plurality of pumping capacitors in response to control of the control logic 140. As described above, the voltage generator 150 may include a charge pump, and the charge pump may include the above-described pumping capacitors. The specific configuration of the charge pump included in the voltage generator 150 may be variously designed.

The address decoder 120, the read and write circuit 130, and the voltage generator 150 may function as a 'peripheral circuit' configured to perform a read operation, a write operation, and an erase operation on the memory cell array 110. The control logic 140 may control the peripheral circuit to perform a read operation, a write operation, and an erase operation on the memory cell array 110.

Figure 3:
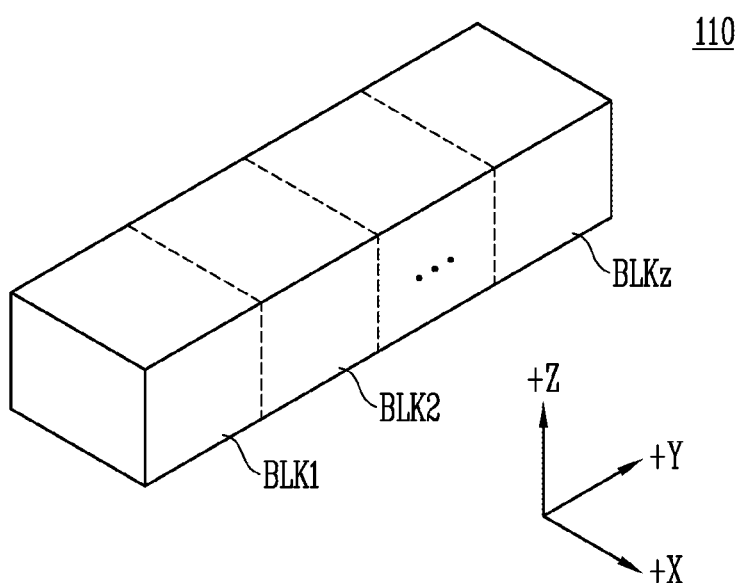
FIG. 3 is a diagram illustrating an embodiment of a memory cell array shown in FIG. 2.

FIG. 3 is a diagram illustrating an embodiment of a memory cell array 110 shown in FIG. 2.

Referring to FIG. 3, the memory cell array 110 may include the plurality of memory blocks BLK1 to BLKz. Each of the memory blocks BLK1 to BLKz may include a three-dimensional structure. Each memory block may include a plurality of memory cells that are stacked over a substrate. The plurality of memory cells may be arranged in +X direction, +Y direction and +Z direction. The structure of each memory block will be described below with reference to FIGS. 4 and 5.

Figure 4:
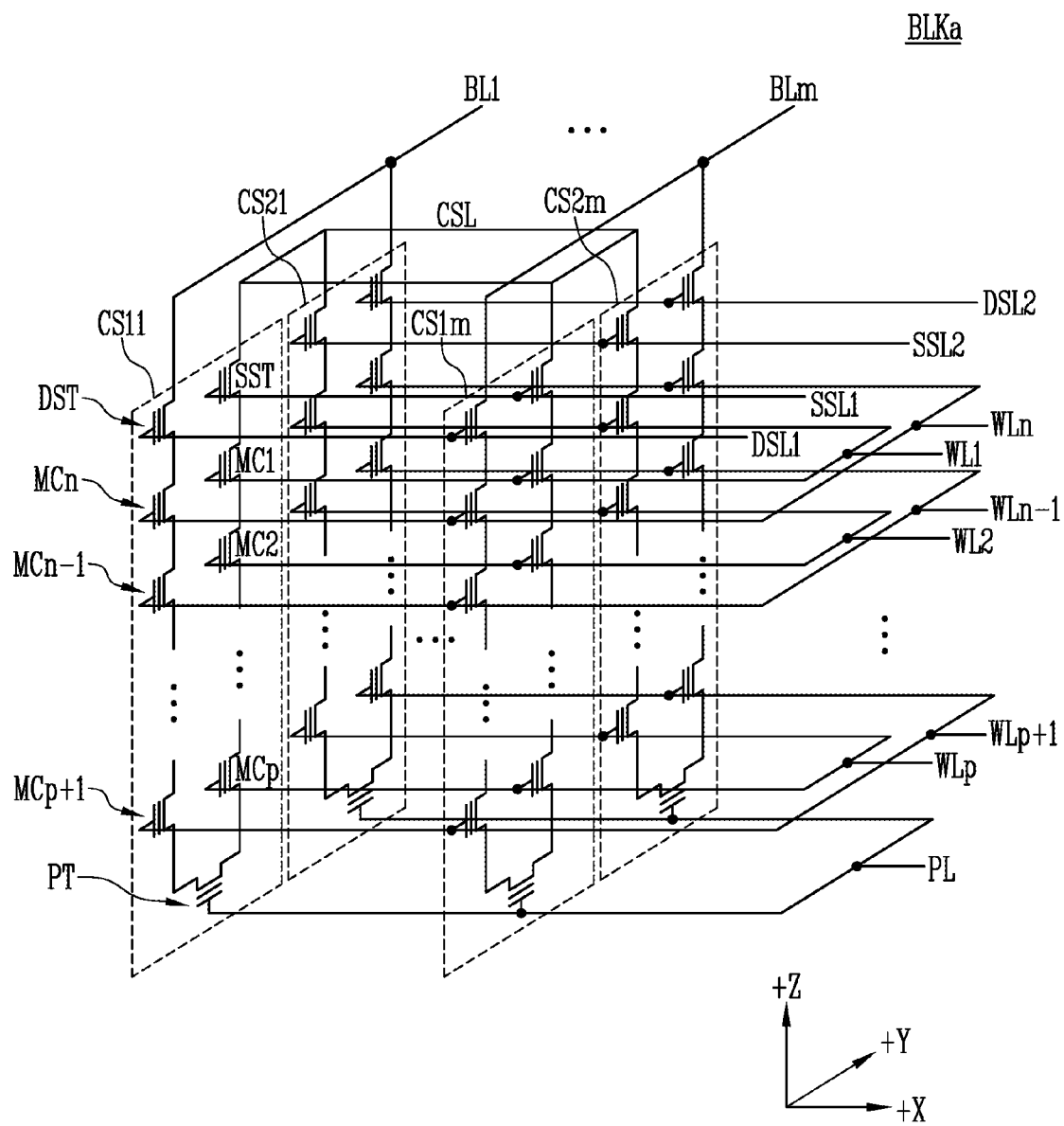
FIG. 4 is a circuit diagram illustrating one memory block (BLKa) of memory blocks BLK1 to BLKz shown in FIG. 3.

FIG. 4 is a circuit diagram illustrating one memory block (BLKa) of the memory blocks BLK1 to BLKz shown in FIG. 3.

Referring to FIG. 4, the memory block BLKa may include a plurality of cell strings CS11 to CS1$m$ and CS21 to CS2$m$. According to an embodiment, each of the plurality of cell strings CS11 to CS1$m$ and CS21 to CS2$m$ may be formed in a 'U' shape. In the memory block BLKa, '$m$' cell strings may be arranged in a row direction (i.e., +X direction). FIG. 3 illustrates two cell strings arranged in a column direction (i.e., +Y direction). However, it is understood that three or more cell strings may be arranged in the column direction.

Each of the cell strings CS11 to CS1$m$ and CS21 to CS2$m$ may include at least one source select transistor SST, first to nth memory cells MC1 to MCn, a pipe transistor PT, and at least one drain select transistor DST.

Each of the select transistors SST and DST and each of the memory cells MC1 to MCn may have similar structures to each other. According to an embodiment, each of the select transistors SST and DST and the memory cells MC1 to MCn may include a channel layer, a tunneling insulating layer, a charge storage layer, and a blocking insulating layer. According to an embodiment, a pillar for providing a channel layer may be provided in each cell string. According to an embodiment, a pillar for providing at least one of the channel layer, the tunneling insulating layer, the charge storage layer, and the blocking insulating layer may be provided to each cell string.

The source select transistor SST of each cell string may be coupled between a common source line CSL and first to pth memory cells MC1 to MCp.

According to an embodiment, source select transistors of cell strings arranged in the same row may be coupled to a source select line extending in a row direction, and source select transistors of cell strings arranged in different rows may be coupled to different source select lines. In FIG. 4, the source select transistors SST of the cell strings CS11 to CS1$m$ in the first row may be coupled to a first source select line SSL1. The source select transistors SST of the cell strings CS21 to CS2$m$ in the second row may be coupled to a second source select line SSL2.

According to another embodiment, the source select transistors SST of the cell strings CS11 to CS1$m$ and CS21 to CS2$m$ may be coupled in common to one source select line.

The first to nth memory cells MC1 to MCn of each cell string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a reverse direction to the +Z direction and may be coupled in series between the source select transistor SST and the pipe transistor PT. The (p+1)th to nth memory cells MCp+1 to MCn may be sequentially arranged in the +Z direction and may be coupled in series between the pipe transistor PT and the drain selection transistor DST. The first to pth memory cells MC1 to MCp and the (p+1)th to nth memory cells MCp+1 to MCn may be coupled through the pipe transistor PT. Gates of the first to nth memory cells MC1 to MCn of each cell string may be coupled to first to nth word lines WL1 to WLn, respectively.

A gate of the pipe transistor PT of each cell string may be coupled to a pipe line PL.

The drain select transistor DST of each cell string may be coupled between a corresponding bit line and the memory cells MCp+1 to MCn. Cell strings arranged in the row direction may be coupled to a drain select line extending in the row direction. The drain select transistors of the cell strings CS11 to CS1$m$ in the first row may be coupled to a first drain select line DSL1. The drain select transistors of the cell strings CS21 to CS2$m$ in the second row may be coupled to a second drain select line DSL2.

Cell strings arranged in the column direction may be coupled to a bit line extending in the column direction. In FIG. 4, the cell strings CS11 and CS21 in the first column may be coupled to the first bit line BL1. The cell strings CS1$m$ and CS2$m$ in the mth column may be coupled to the mth bit line BLm.

Memory cells coupled to the same word line arranged in cell strings arranged in the row direction may form a single page. For example, memory cells coupled to the first word line WL1 in the cell strings CS11 to CS1$m$ in the first row may constitute a single page. Memory cells coupled to the first word line WL1 in the cell strings CS21 to CS2$m$ in the second row may constitute another page. When one of the drain select lines DSL1 and DSL2 is selected, cell strings arranged in one row direction may be selected. When one of the first to nth word lines WL1 to WLn is selected, one page may be selected from the selected cell strings.

According to another embodiment, even bit lines and odd bit lines may replace the first to mth bit lines BL1 to BLm. In addition, even cell strings of the cell strings CS11 to CS1$m$ or CS21 to CS2$m$ arranged in the row direction may be coupled to the even bit lines, respectively, and odd cell strings of the cell strings CS11 to CS1$m$ or CS21 to CS2$m$ arranged in the row direction may be coupled to the odd bit lines, respectively.

According to an embodiment, at least one of the first to nth memory cells MC1 to MCn may serve as a dummy memory cell. For example, one or more dummy memory cells may be provided to reduce an electric field between the source select transistor SST and the memory cells MC1 to MCp. Alternatively, one or more dummy memory cells may be provided to reduce an electric field between the drain select transistor DST and the memory cells MCp+1 to MCn. In an embodiment, when more dummy memory cells are provided, the operational reliability of the memory block BLKa may be improved, whereas the size of the memory block BLKa may be increased. On the other hand, in an embodiment, when the number of dummy memory cells decreases, the size of the memory block BLKa may be reduced, and the operational reliability of the memory block BLKa may be reduced.

In order to efficiently control one or more dummy memory cells, each of the dummy memory cells may have a required threshold voltage. Before or after an erase operation on the memory block BLKa, program operations may be performed on a portion or entirety of the dummy memory cells. When an erase operation is performed after a program operation is performed, the dummy memory cells may have required threshold voltages by controlling a voltage applied to dummy word lines coupled to the dummy memory cells.

Figure 5:
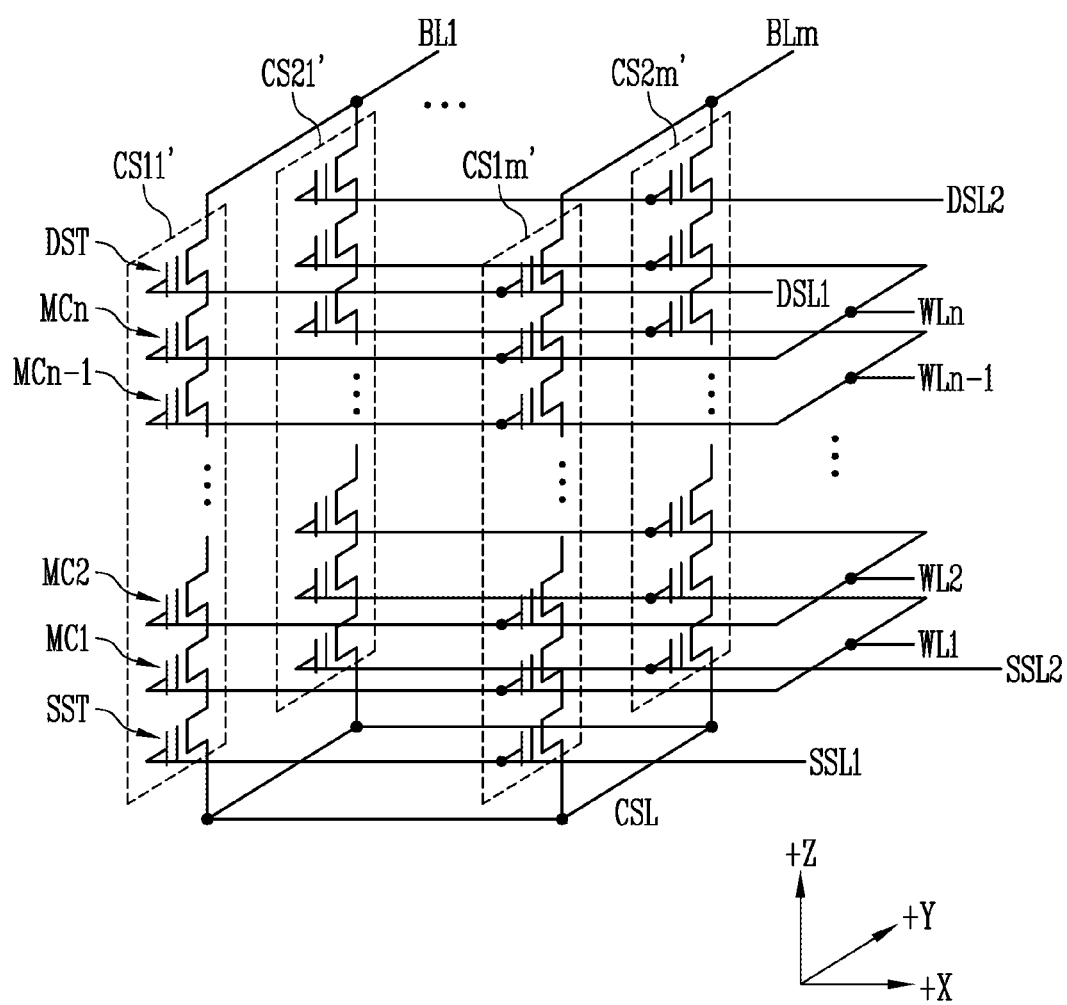
FIG. 5 is a circuit diagram illustrating another embodiment of one memory block (BLKb) of memory blocks BLK1 to BLKz shown in FIG. 3.

FIG. 5 is a circuit diagram illustrating another embodiment of one memory block (BLKb) of the memory blocks BLK1 to BLKz shown in FIG. 3.

Referring to FIG. 5, the memory block BLKb may include a plurality of cell strings CS11' to CS1$m$' and CS21' to CS2$m$'. Each of the plurality of cell strings CS11' to CS1$m$' and CS21' to CS2$m$' may extend in the +Z direction. Each of the plurality of cell strings CS11' to CS1$m$' and CS21' to CS2$m$' may include at least one source select transistor SST, the first to nth memory cells MC1 to MCn, and at least one drain select transistor DST which are stacked on a substrate (not shown) under the memory block BLKb.

The source select transistor SST of each cell string may be coupled between the common source line CSL and the memory cells MC1 to MCn. Source select transistors of cell strings arranged in the same row may be coupled to the same source select line. Source select transistors of the cell strings CS11' to CS1m' arranged in the first row may be coupled to the first source select line SSL1. Source select transistors of the cell strings CS21' to CS2m' arranged in the second row may be coupled to the second source select line SSL2. According to another embodiment, the source select transistors of the cell strings CS11' to CS1m' and CS21' to CS2m' may be coupled in common to one source select line.

The first to nth memory cells MC1 to MCn of each cell string may be coupled in series between the source select transistor SST and the drain select transistor DST. Gates of the first to nth memory cells MC1 to MCn may be coupled to the first to nth word lines WL1 to WLn, respectively.

The drain select transistor DST of each cell string may be coupled between a corresponding bit line and the memory cells MC1 to MCn. Drain select transistors of cell strings arranged in a row direction may be coupled to a drain select line extending in the row direction. The drain select transistors DST of the cell strings CS11' to CS1m' in the first row may be coupled to the first drain select line DSL1. The drain select transistors of the cell strings CS21' to CS2m' in the second row may be coupled to the second drain selection line DSL2.

As a result, the memory block BLKb shown in FIG. 5 may have a similar equivalent circuit to the memory block BLKa shown in FIG. 4 except that the pipe transistor PT is removed from each cell string of the memory block BLKb.

In another embodiment, even bit lines and odd bit lines may be provided instead of the first to mth bit lines BL1 to BLm. In addition, even cell strings of the cell strings CS11' to CS1m' or CS21' to CS2m' arranged in the row direction may be coupled to the even bit lines, respectively, and odd cell strings of the cell strings CS11' to CS1m' or CS21' to CS2m' arranged in the row direction may be coupled to the odd bit lines, respectively.

According to an embodiment, at least one of the first to nth memory cells MC1 to MCn may serve as a dummy memory cell. For example, one or more dummy memory cells may be provided to reduce an electric field between the source select transistor SST and the first to nth memory cells MC1 to MCn. Alternatively, one or more dummy memory cells may be provided to reduce an electric field between the drain select transistor DST and the memory cells MC1 to MCn. In an embodiment, when more dummy memory cells are provided, the operational reliability of the memory block BLKb may be improved, whereas the size of the memory block BLKb may be increased. On the other hand, in an embodiment, when the number of dummy memory cells decreases, the size of the memory block BLKb may be reduced, and the operational reliability of the memory block BLKb may be reduced.

In order to efficiently control one or more dummy memory cells, each of the dummy memory cells may have a required threshold voltage. Before or after an erase operation on the memory block BLKb, program operations may be performed on a portion or entirety of the dummy memory cells. When an erase operation is performed after a program operation is performed, the dummy memory cells may have required threshold voltages by controlling a voltage applied to dummy word lines coupled to the dummy memory cells.

Figure 6:
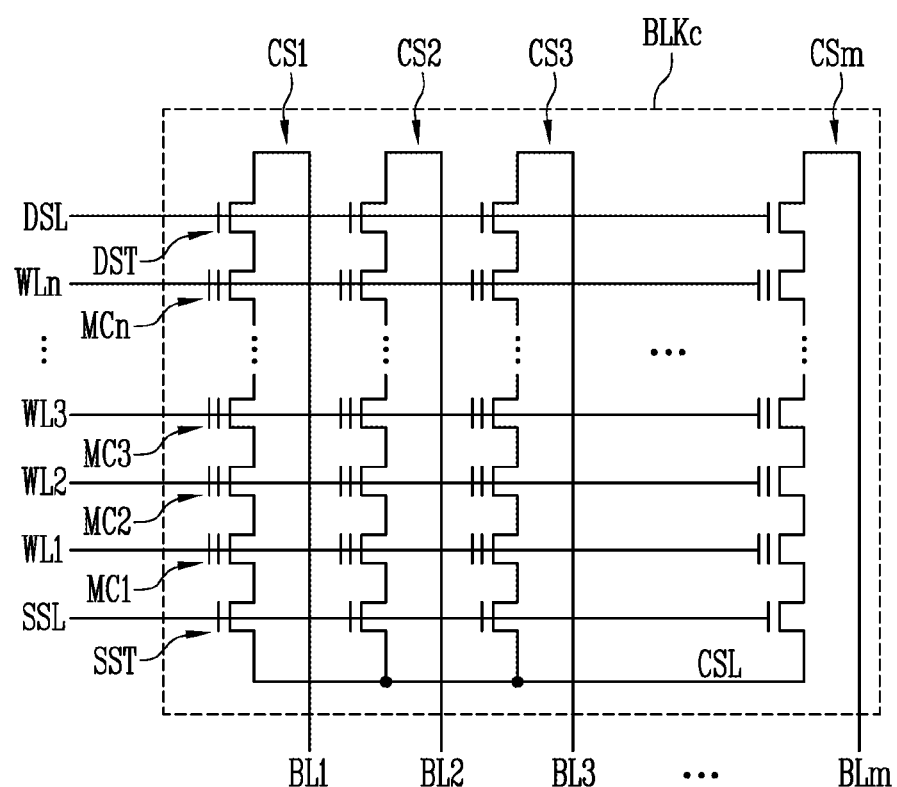
FIG. 6 is a circuit diagram illustrating an embodiment of one memory block (BLKc) of memory blocks BLK1 to BLKz included in a memory cell array 110 shown in FIG. 2.

FIG. 6 is a circuit diagram illustrating an embodiment of one memory block (BLKc) of the memory blocks BLK1 to BLKz included in a memory cell array 110 shown in FIG. 2.

Referring to FIG. 6, the memory block BLKc may include the plurality of cell strings CS1 to CSm. The plurality of cell strings CS1 to CSm may be coupled to the plurality of bit lines BL1 to BLm, respectively. Each of the cell strings CS1 to CSm may include at least one source select transistor SST, the first to nth memory cells MC1 to MCn, and at least one drain select transistor DST.

Each of the select transistors SST and DST and each of the memory cells MC1 to MCn may have similar structures to each other. According to an embodiment, each of the select transistors SST and DST and the memory cells MC1 to MCn may include a channel layer, a tunneling insulating layer, a charge storage layer, and a blocking insulating layer. According to an embodiment, a pillar for providing a channel layer may be provided in each cell string. According to an embodiment, a pillar for providing at least one of the channel layer, the tunneling insulating layer, the charge storage layer, and the blocking insulating layer may be provided to each cell string.

The source select transistor SST of each cell string may be coupled between the common source line CSL and the first to nth memory cells MC1 to MCn.

The first to nth memory cells MC1 to MCn of each cell string may be coupled between the source select transistor SST and the drain select transistor DST.

The drain select transistor DST of each cell string may be coupled between a corresponding bit line and the memory cells MC1 to MCn.

Memory cells coupled to the same word line may form a single page. When the drain select line DSL is selected, the cell strings CS1 to CSm may be selected. When one of the first to nth word lines WL1 to WLn is selected, one page may be selected from the selected cell strings.

In another embodiment, even bit lines and odd bit lines may be provided instead of the first to mth bit lines BL1 to BLm. Even cell strings of the cell strings CS1 to CSm may be coupled to the even bit lines, respectively, and odd cell strings thereof may be coupled to the odd bit lines, respectively.

Figure 7:
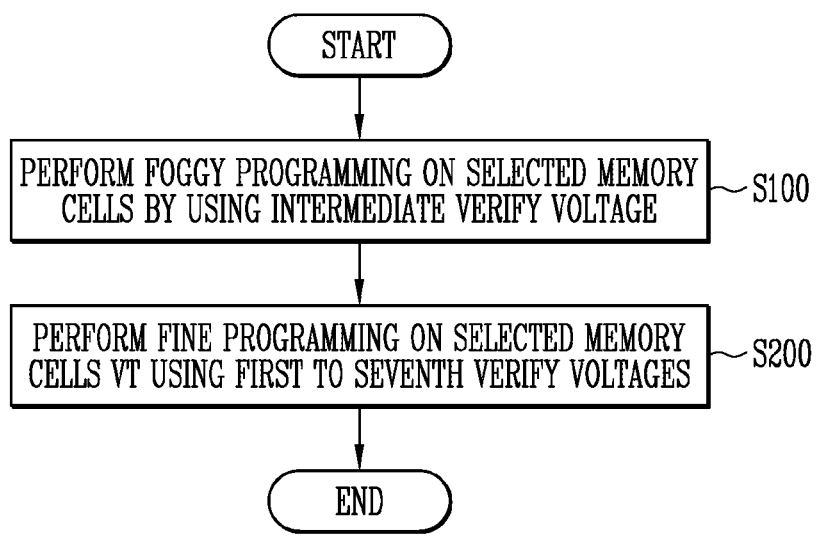
FIG. 7 is a flowchart illustrating a method of operating a semiconductor memory device according to an embodiment of the present disclosure.

FIG. 7 is a flowchart illustrating a method of operating the semiconductor memory device 100 according to an embodiment of the present disclosure. For convenience of discussion, the method of operating the semiconductor memory device according to the present disclosure is described based on a program operation of a triple-level cell (TLC) with reference to FIGS. 7 to 23. However, the above description is made only for illustrative purposes. The method of operating the semiconductor memory device according to the present disclosure may be applicable to a multi-level cell (MLC) or a quad-level cell (QLC). In other words, the present disclosure may be applied to a semiconductor memory device which stores N bits of data in each memory cell.

According to an embodiment, a foggy-fine program scheme may be used to improve an interference phenomenon affecting an adjacent cell due to a program operation in a three-dimensional memory cell array. The foggy-fine program scheme may refer to a program method which includes a foggy programming step of programming selected memory cells to an intermediate program state $P_{IS}$ first, and then a fine programming step of programming the selected memory cells to target program states PV1 to PV7.

Referring to FIG. 7, a method of operating a semiconductor memory device according to an embodiment of the present disclosure may include performing foggy programming selected memory cells using an intermediate verify voltage $VRF_{IS}$ at step S100 and performing fine programming the selected memory cells using first to seventh verify voltages at step S200. In the present disclosure, the term "selected memory cells" may mean memory cells that belong to a physical page which is subject to programming. The selected memory cells may be coupled to a selected word line.

At step S100, a threshold voltage distribution of the selected memory cells may change from an erase state $E_0$ to an erase state $E_{IS}$ and the intermediate program state $P_{IS}$. Foggy programming may refer to a programming operation performed to temporarily change the threshold voltage distribution of the memory cells to the erase state $E_{IS}$ and the intermediate program state $P_{IS}$ before changing the threshold voltage distribution of the memory cells to an erase state E and the target program states PV1 to PV7. The intermediate verify voltage $VRF_{IS}$ may be a verify voltage which is used to change a threshold voltage distribution of at least some of the memory cells corresponding to the erase state $E_0$ to the intermediate verify voltage $VRF_{IS}$. Step S100 will be described below with reference to FIGS. 8 and 10.

At step S200, the threshold voltage distribution of the selected memory cells may change from the erase state $E_{IS}$ and the intermediate program state $P_{IS}$ to the erase state E and the target program states PV1 to PV7. Since the selected memory cells are TLCs, the threshold voltage distribution of the memory cells may belong to one of the eight states, i.e., the erase state E and the target program states PV1 to PV7 after a program operation is terminated. When each memory cell stores N bits, a threshold voltage distribution of the memory cells may belong to one of $2^N$ states, i.e., the erase state E and target program states PV1 to PV($2^N-1$) after a program operation is terminated.

For example, at step S200, the threshold voltage distribution of the memory cells which belong to the erase state $E_{IS}$ may be changed to the erase state E and the first to third target program states PV1 to PV3. When each of the memory cells stores N bits, the threshold voltage distribution of the memory cells corresponding to the erase state $E_{IS}$ may be changed to the erase state E and the first to ($2^{N-1}-1$)th target program states PV1 to PV($2^{N-1}-1$).

In addition, at step S200, the threshold voltage distribution of the memory cells which belong to the intermediate program state $P_{IS}$ may be changed to the fourth to seventh target program states PV4 to PV7. When each memory cell stores N bits, the threshold voltage distribution of the memory cells that belong to the intermediate program state $P_{IS}$ may be changed to ($2^{N-1}$)th to ($2^N-1$)th target program states.

The first to seventh verify voltages may be used to change the threshold voltage distribution of the memory cells corresponding to the erase state $E_{IS}$ and the intermediate program state $P_{IS}$ to the erase state E and the target program states PV1 to PV7. For example, when each memory cell stores N bits, first to ($2^{N-1}$)th verify voltages may be used. Step S200 will be described below with reference to FIGS. 9 and 10.

Figure 8:
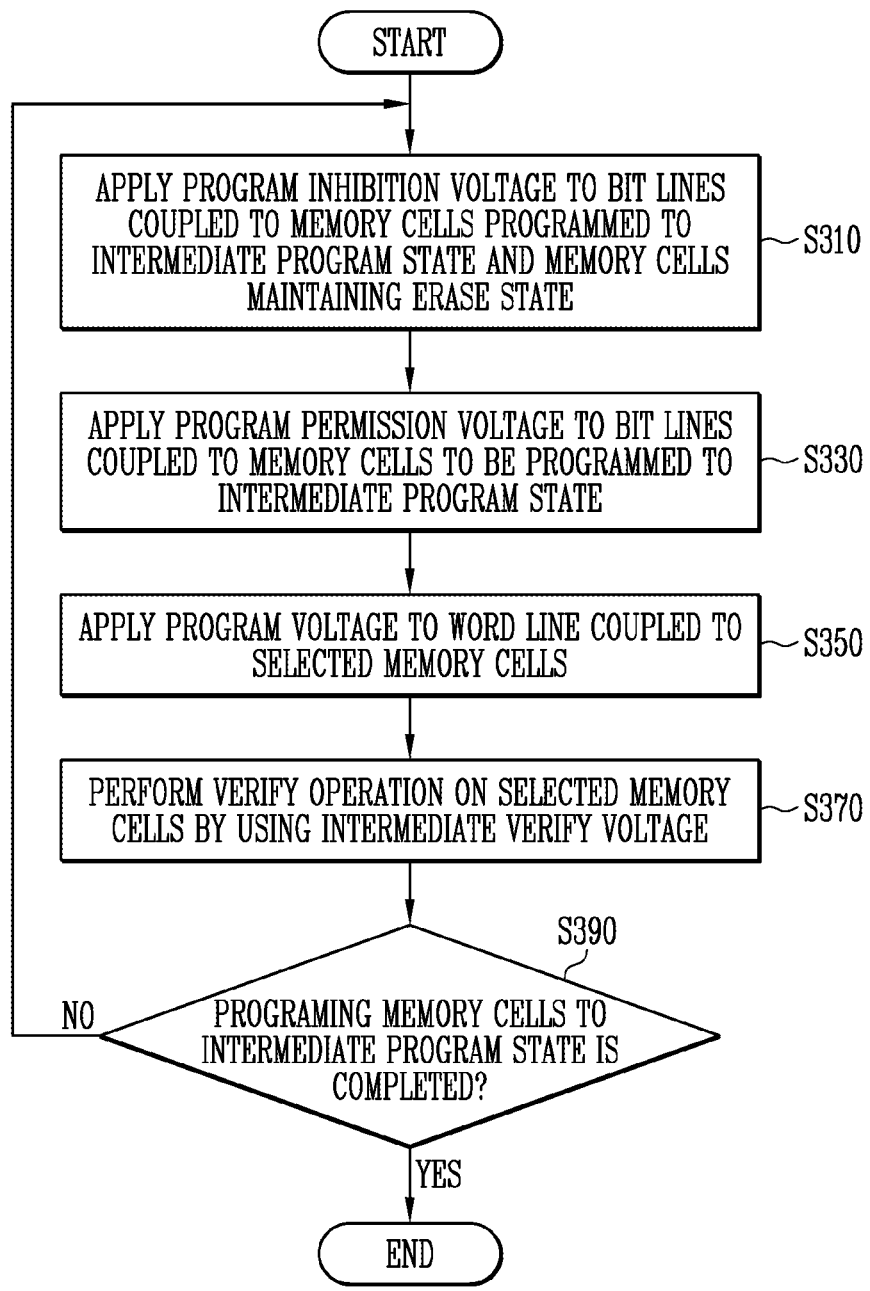
FIG. 8 is a flowchart illustrating an embodiment of step S100 shown in FIG. 7.
Figure 9:
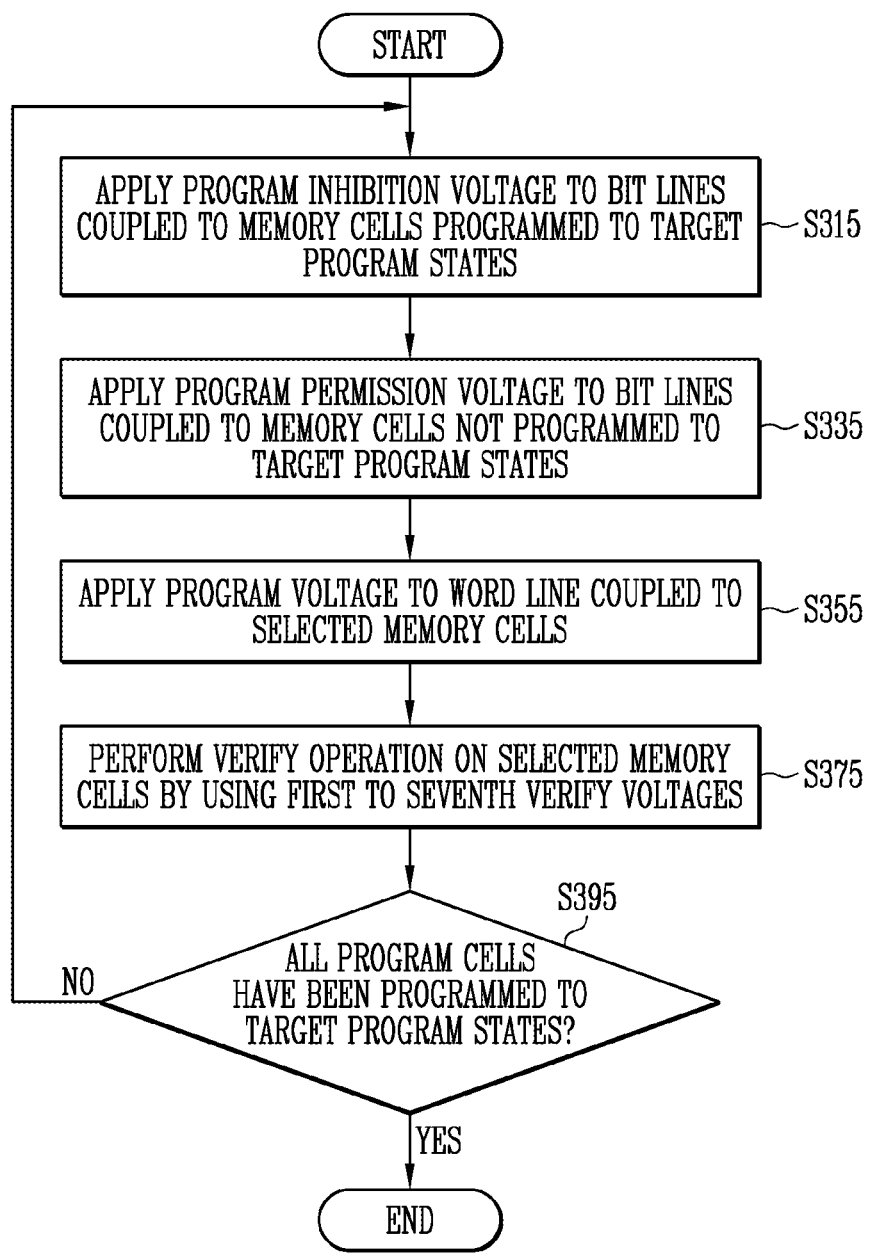
FIG. 9 is a flowchart illustrating an embodiment of step S200 shown in FIG. 7.
Figure 10:
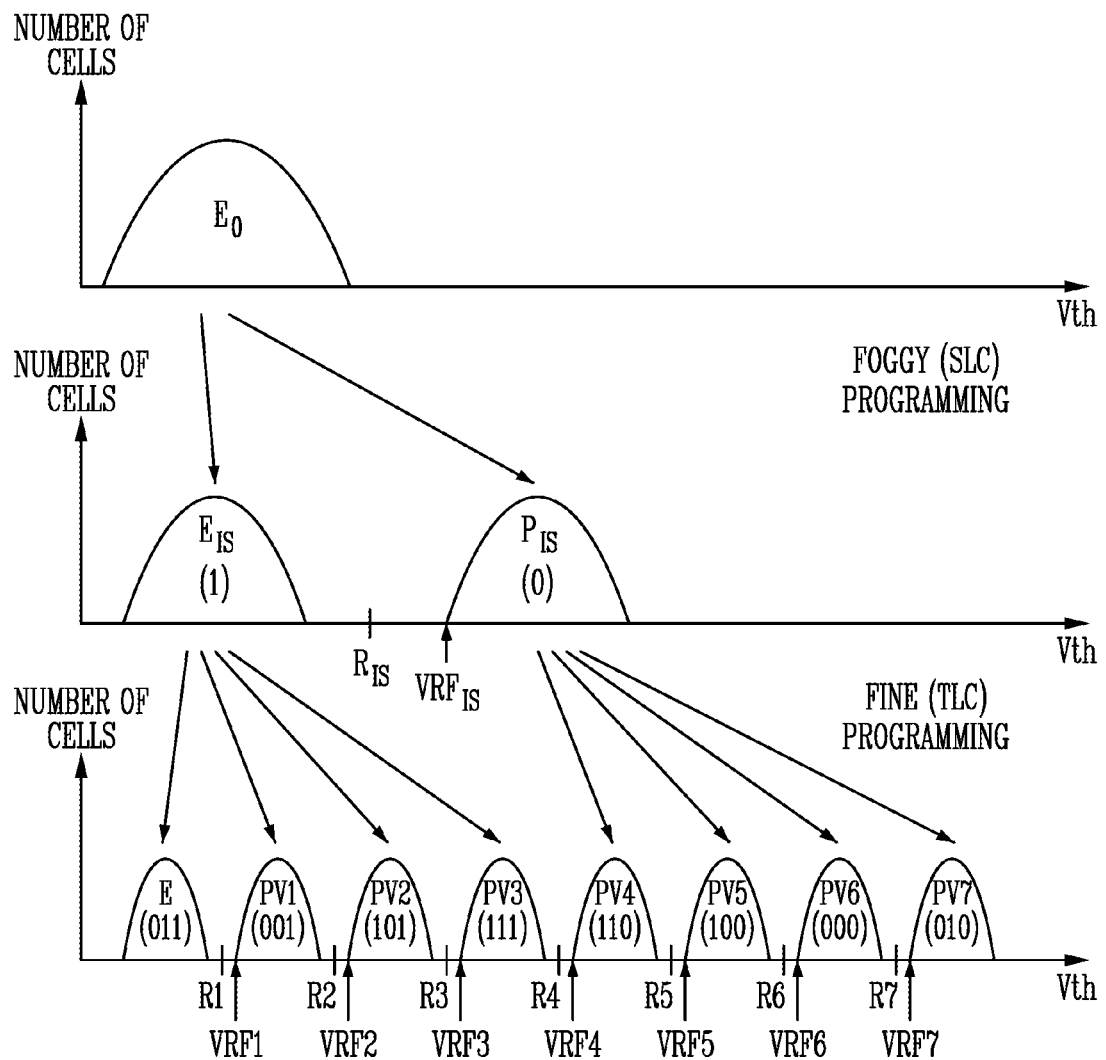
FIG. 10 is a diagram illustrating a threshold voltage distribution of selected memory cells when a program operation is performed according to a method shown in FIGS. 7, 8, and 9.

FIG. 8 is a flowchart illustrating an embodiment of step S100 shown in FIG. 7. FIG. 9 is a flowchart illustrating an embodiment of step S200 shown in FIG. 7. FIG. 10 is a diagram illustrating a threshold voltage distribution of selected memory cells when a program operation is performed according to a method shown in FIGS. 7 to 9.

Hereinafter, step S100 of FIG. 7 is described with reference to FIGS. 8 and 10.

Referring to FIG. 8, step S100 may include applying a program inhibition voltage to bit lines coupled to memory cells programmed to the intermediate program state $P_{IS}$ and memory cells maintaining the erase state $E_{IS}$ (S310), applying a program permission voltage to bit lines coupled to memory cells to be programmed to the intermediate program state $P_{IS}$ (S330), applying a program voltage to a word line coupled to selected memory cells (S350), performing a verify operation on the selected memory cells using the intermediate verify voltage $VRF_{IS}$ (S370), and determining whether the selected memory cells are completely programmed to the intermediate program state $P_{IS}$ (S390).

According to an embodiment, each of the memory cells maintaining the erase state $E_{IS}$, among the selected memory cells, may have a least significant bit (LSB) of 1. The memory cells to be programmed to the intermediate program state $P_{IS}$, among the selected memory cells, may have a least significant bit (LSB) of 0. As shown in FIG. 10, the memory cells maintaining the erase state $E_{IS}$ may have a least significant bit (LSB) of 1, and the memory cells to be programmed to the intermediate program state $P_{IS}$ have a least significant bit (LSB) of 0. In other words, a foggy programming operation at step S100 may be substantially the same as a single-level cell (SLC) program operation.

As shown in FIG. 8, steps S310, S330, S350, and S370 may be repeated until programming the selected memory cells to the intermediate program state is completed. In other words, the foggy programming operation of the selected memory cells may include a plurality of program loops. Each of the program loops may include steps S310, S330, S350, and S370.

At step S310, as a result of performing a verify operation in the previous program loop at step S370, a program inhibition voltage may be applied to bit lines respectively coupled to memory cells which are completely programmed among the memory cells to be programmed to the intermediate program state $P_{IS}$ and the memory cells maintaining the erase state $E_{IS}$. Threshold voltages of the program-completed memory cells among the memory cells to be programmed to the intermediate program state $P_{IS}$ and the memory cells maintaining the erase state $E_{IS}$ should not to be increased any longer. Thus, the program inhibition voltage may be applied to the bit lines respectively coupled to the program-completed memory cells among the memory cells to be programmed to the intermediate program state $P_{IS}$ and the memory cells maintaining the erase state $E_{IS}$ so as not to increase the threshold voltages of the corresponding memory cells even when a program voltage is applied to a selected word line (S350).

At step S330, a program permission voltage may be applied to bit lines coupled to memory cells which are not completely programmed among the memory cells to be programmed to the intermediate program state $P_{IS}$ as the result of performing the verify operation in the previous program loop at step S370. In this manner, when the program voltage is applied to the selected word line (S350), the threshold voltages of the corresponding memory cells may be increased.

FIG. 8 shows that step S330 is performed after step S310. However, the present disclosure is not limited thereto. Steps S310 and S330 may be related to bit line voltage setting for program cells and program-inhibited cells. Therefore, step S310 may be performed after step S330, or steps S310 and S330 may be performed at the same time.

Subsequently, at step S350, a program voltage may be applied to a word line coupled to the selected memory cells. Therefore, threshold voltages of program cells, among the selected memory cells, may be increased, whereas threshold voltages of program-inhibited cells might not be increased. More specifically, the selected memory cells may include memory cells to be programmed to the intermediate program state $P_{IS}$ and memory cells to maintain the erase state $E_{IS}$. Memory cells having threshold voltages greater than the intermediate verify voltage $VRF_{IS}$ among the memory cells to be programmed to the intermediate program state $P_{IS}$ may be 'program-inhibited cells.' Memory cells having threshold voltages smaller than the intermediate verify voltage $VRF_{IS}$ may be 'program cells.' At the early stage of the program operation, all memory cells may have threshold voltages corresponding to the erase state $E_0$. Therefore, all memory cells to be programmed to the intermediate program state $P_{IS}$ may be program cells. As a program loop is repeated, threshold voltages of the program cells may gradually increase and threshold voltages of some of the memory cells may be greater than the intermediate verify voltage $VRF_{IS}$. On the other hand, memory cells having threshold voltages greater than the intermediate verify voltage $VRF_{IS}$ may be program-inhibited cells. When the program loop continues to be repeated, the threshold voltages of the memory cells to be programmed to the intermediate program state $P_{IS}$ may end up being greater than the intermediate verify voltage $VRF_{IS}$. As a result, all memory cells to be programmed to the intermediate program state $P_{IS}$ may be program-inhibited cells.

The memory cells to maintain the erase state $E_{IS}$ may be program-inhibited cells from the early stage of the program operation.

At step S370, a verify operation may be performed on memory cells to be programmed to an intermediate program state using the intermediate verify voltage $VRF_{IS}$. More specifically, by applying the intermediate verify voltage $VRF_{IS}$ to the selected word line at step S370, it may be determined whether threshold voltages of the memory cells to be programmed to the intermediate program state are greater than the intermediate verify voltage $VRF_{IS}$. Memory cells having threshold voltages greater than the intermediate verify voltage $VRF_{IS}$ as a result of applying the program voltage in the current program loop at step S350, among the memory cells which are program cells according to the verify result of the previous verify operation, may be changed to program-inhibited cells.

It may be determined whether the memory cells to be programmed to the intermediate program state have been programmed to the intermediate program state at step S390. More specifically, step S100 may end when threshold voltages of all memory cells to be programmed to the intermediate program state $P_{IS}$ are greater than the intermediate verify voltage $VRF_{IS}$ (S390: YES). When threshold voltages of at least some of the memory cells to be programmed to the intermediate program state $P_{IS}$ are less than the intermediate verify voltage $VRF_{IS}$ (S390: NO), the process may proceed to step S310 and a subsequent program loop may be repeated.

As the foggy programming operation is performed according to the steps of FIG. 8, a threshold voltage distribution corresponding to the initial erase state $E_0$ may be changed to the erase state $E_{IS}$ and the intermediate program state $P_{IS}$ as shown in FIG. 10. The memory cells maintaining the erase state $E_{IS}$ and the memory cells programmed to the intermediate program state $P_{IS}$ may be differentiated from each other according to the LSB of each memory cell. In other words, the foggy programming operation may be substantially the same as an SLC program operation based on the LSB of each of the memory cells. The threshold voltage distribution of the memory cells when the foggy programming operation is completed may be divided in to the erase state $E_{IS}$ and the intermediate program state $P_{IS}$. Therefore, the LSB of each memory cell may be read using an intermediate read voltage $R_{IS}$.

Hereinafter, step S200 of FIG. 7 is described with reference to FIGS. 9 and 10.

Referring to FIG. 9, step S200 may include applying a program inhibition voltage to bit lines coupled to memory cells programmed to the target program states PV1 to PV7 (S315), applying a program permission voltage to bit lines coupled to memory cells not programmed to the target program states PV1 to PV7 (S335), applying a program voltage to a word line coupled to selected memory cells (S355), performing a verify operation on the selected memory cells using first to seventh verify voltages VRF1 to VRF7 (S375), and determining whether the selected memory cells are programmed to the target program states PV1 to PV7 (S395).

As shown in FIG. 10, steps S315, S335, S355, and S375 may be repeated until programming the selected memory cells to the target program states is completed. In other words, a fine programming operation of the selected memory cells may include a plurality of program loops. Each of the program loops may include steps S315, S335, S355, and S375.

At step S315, a program inhibition voltage may be applied to bit lines coupled to memory cells which are completely programmed, among the memory cells to be programmed to the target program states PV1 to PV7 as a result of performing the verify operation in the previous program loop at step S375. In addition, the program inhibition voltage may be applied to bit lines coupled to memory cells maintaining the erase state E.

At step S335, a program permission voltage may be applied to each of the bit lines coupled to memory cells which are not completely programmed, among the memory cells to be programmed to the target program states PV1 to PV7, as the result of performing the verify operation in the previous program loop at step S375. In this manner, when the program voltage is applied to the selected word line at step S355, the threshold voltages of the corresponding memory cells may be increased.

FIG. 9 shows that step S335 is performed after step S315. However, the present disclosure is not limited thereto. Steps S315 and S335 may be related to bit line voltage setting for program cells and program-inhibited cells. Therefore, step S315 may be performed after step S330, or steps S315 and S335 may be performed at the same time.

Subsequently, at step S355, a program voltage may be applied to a word line coupled to selected memory cells. Therefore, threshold voltages of program cells, among the selected memory cells, may be increased, whereas threshold voltages of program-inhibited cells might not be increased.

At step S375, a verify operation may be performed on the selected memory cells using the first to seventh verify voltages VRF1 to VRF7. More specifically, by applying the first to seventh verify voltages VRF1 to VRF7 to the selected word line at step S375, it may be determined whether threshold voltages of the selected memory cells are greater than the first to seventh verify voltages VRF1 to VRF7 corresponding thereto.

For example, when a threshold voltage of a memory cell to be programmed to the third target program state PV3 is greater than the third verify voltage VRF3, the corresponding memory cell may be a program-inhibited cell. In another example, when a threshold voltage of a memory cell to be programmed to the fifth target program state PV5 is less than the fifth verify voltage VRF5, the corresponding memory cell may be a program cell.

At step S395, it may be determined whether the selected memory cells have been completely programmed to the target program states respectively corresponding thereto. When the threshold voltages of all selected memory cells are greater than the corresponding verify voltages (S395: YES), step S200 may end. When threshold voltages of at least some of the selected memory cells are less than the corresponding verify voltages (S395: NO), the process may proceed to step S315, and a subsequent program loop may be repeated.

As the fine programming operation is performed according to the steps of FIG. 9, the threshold voltage distribution of the erase state $E_{IS}$ and the intermediate program state $P_{IS}$ may be changed to the erase state E and the first to seventh target program states PV1 to PV7. More specifically, the threshold voltage distribution of the memory cells corresponding to the erase state $E_{IS}$ may be changed to the erase state E and the first to third target program states PV1 to PV3, and the threshold voltage distribution of the intermediate program state $P_{IS}$ may be changed to the fourth to seventh target program states PV4 to PV7.

The memory cells corresponding to the erase state E and the first to seventh target program states PV1 to PV7 may be divided according to an MSB, a CSB, and an LSB of each of the memory cells. In the example of FIG. 10, the memory cell corresponding to the erase state E may have the MSB of 0, the CSB of 1, and the LSB of 1. In addition, in the example of FIG. 10, the memory cell corresponding to the first target program state PV1 may have the MSB of 0, the CSB of 0, and the LSB of 1.

After the fine programming operation is completed, the LSB of each of the selected memory cells may be read through a fourth read voltage R4. As shown in FIG. 10, all memory cells located at the left side on the basis of the fourth read voltage R4 may have the LSB of 1, and all memory cells located at the right side may have the LSB of 0. Therefore, an LSB read operation may be performed on the memory cells through the fourth read voltage R4. As shown in FIG. 10, the read voltage for the LSB read operation when the foggy programming operation is completed may be intermediate read voltage $R_{IS}$, and the read voltage for the LSB read operation when the fine programming operation is completed may be the fourth read voltage R4 greater than the intermediate read voltage $R_{IS}$.

Figure 11:
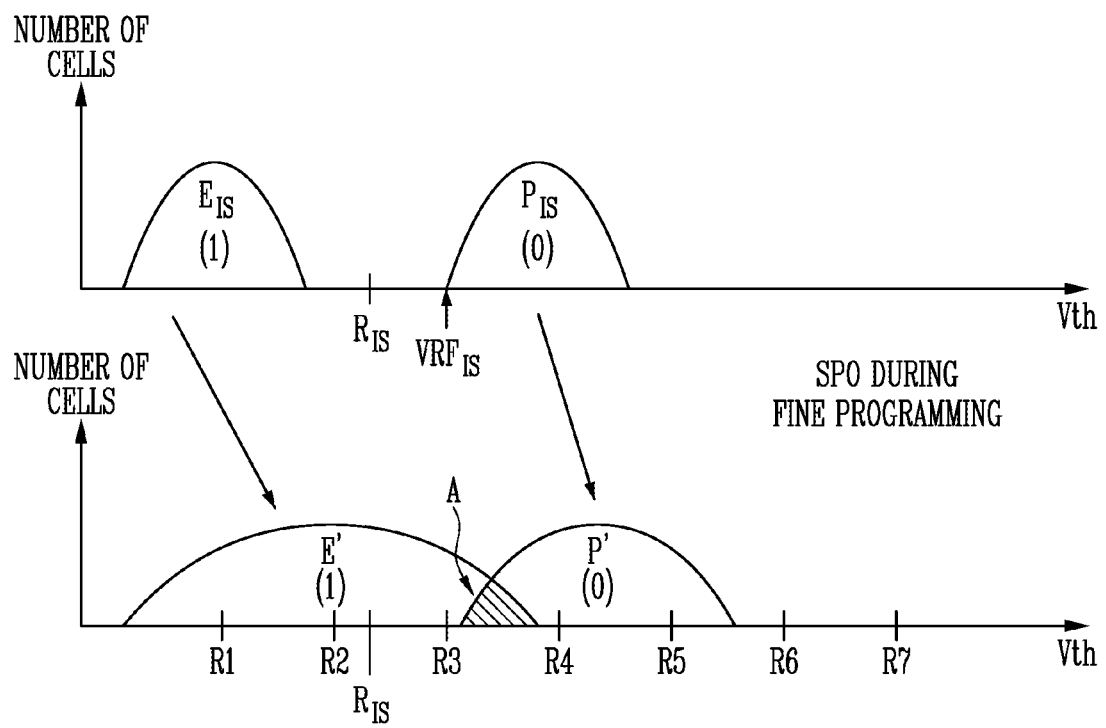
FIG. 11 is a diagram illustrating a threshold voltage distribution of selected memory cells when a sudden power-off (SPO) occurs when a program operation is performed according to a method shown in FIGS. 7, 8, and 9.

FIG. 11 is a diagram illustrating a threshold voltage distribution of selected memory cells when a sudden power-off (SPO) occurs when a program operation is performed according to the method shown in FIGS. 7 to 9. For convenience of discussion, a description of the processes of performing the foggy programming operation at the initial erase state $E_0$ is omitted.

Referring to FIG. 11, after the foggy programming operation is completed, and the threshold voltage distribution of the memory cells is changed to the erase state $E_{IS}$ and the intermediate program state $P_{IS}$, a sudden power-off (SPO) may occur during the fine programming operation. In other words, if the SPO occurs when the threshold voltage distribution of the memory cells corresponding to the erase state $E_{IS}$ is changed to the erase state E and the first to third target program states PV1 to PV3 by the fine programming operation, the threshold voltage distribution of the memory cells corresponding to the erase state $E_{IS}$ may be changed to an erase state E'. In addition, if the SPO occurs when the threshold voltage distribution of the memory cells corresponding to the intermediate program state $P_{IS}$ is changed to the fourth to seventh target program states PV4 to PV7 by the fine programming operation, the threshold voltage distribution of the memory cells corresponding to the intermediate program state $P_{IS}$ may be changed to an intermediate program state P'.

As shown in FIG. 11, when the memory device 100 performs the LSB read operation to resume the program operation after the SPO occurs, a read failure may occur. In other words, when the LSB read operation is performed using the intermediate read voltage $R_{IS}$, the memory cells corresponding to the intermediate program state P' may be properly read as '0 (zero)'. However, some of the bits of the memory cells corresponding to the erase state E' may be read incorrectly as 0. More specifically, the LSB of each of the memory cells having threshold voltages smaller than the intermediate read voltage $R_{IS}$, among the memory cells corresponding to the erase state E', may be properly read as '1 (one)'. However, the LSB of each of the memory cells having threshold voltages greater than the intermediate read voltage $R_{IS}$, among the memory cells corresponding to the erase state E', may be read incorrectly as 0.

When the LSB read operation is performed using the fourth read voltage R4, a bit of each of the memory cells corresponding to the erase state E' may be properly read as '1 (one)'. However, some of the bits of each of the memory cells corresponding to the intermediate program state P' may be incorrectly read as 1. More specifically, the LSB of each of the memory cells having threshold voltages greater than the fourth read voltage R4, among the memory cells corresponding to the intermediate program state P', may be properly read as '0 (zero)'. However, the LSB of each of the memory cells having threshold voltages smaller the fourth read voltage R4, among the memory cells corresponding to the intermediate program state P', may be read incorrectly as 1.

In addition, when the LSB read operation is performed using a plurality of sampling read voltages existing between the intermediate read voltage $R_{IS}$ and the fourth read voltage R4, there may be an overlapping section between the threshold voltage distribution of the memory cells corresponding to the erase state E' and the threshold voltage distribution corresponding to the intermediate program state P'. In other words, error correction of read data may fail due to the memory cells corresponding to the hatched area "A" in FIG. 11 even when the LSB read operation is performed using a plurality of read voltages.

The example in which the SPO occurs during the fine programming operation is described. However, the same phenomenon may occur when a program operation is suspended in response to a program suspend command from the controller during the fine programming operation.

According to the method of operating the semiconductor memory device according to an embodiment of the present disclosure, in association with a program operation using a foggy-fine program method, dividing selected memory cells into a plurality of groups according to corresponding target program states, and applying a program voltage to memory cells included in each group may be performed separately. Therefore, even when the program operation is suspended by the SPO or the program suspend command, LSB data may be normally read from the memory cells. Accordingly, data reliability of the semiconductor memory device may be improved.

Figure 12:
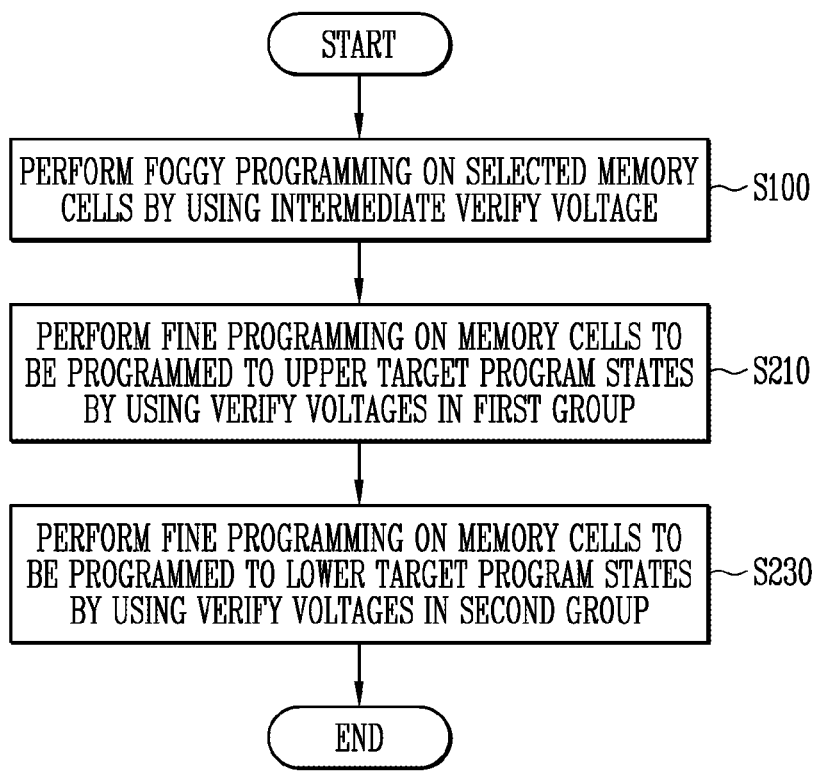
FIG. 12 is a flowchart illustrating a method of operating a semiconductor memory device according to another embodiment of the present disclosure.

FIG. 12 is a flowchart illustrating a method of operating a semiconductor memory device according to another embodiment of the present disclosure. According to another embodiment, a foggy-fine program scheme may be used to improve an interference phenomenon affecting an adjacent cell caused by a program operation in a three-dimensional memory cell array.

Referring to FIG. 12, a method of operating a semiconductor memory device according to an embodiment of the present disclosure may include performing foggy programming on selected memory cells using the intermediate verify voltage $VRF_{IS}$ (S100), performing fine programming on memory cells to be programmed to upper target program states (PV4 to PV7) using verify voltages (VRF4 to VRF7) in the first group (S210), and performing fine programming on memory cells to be programmed to lower target program states (PV1 to PV3) using verify voltages (VRF1 to VRF3) in the second group (S230).

At step S100, a threshold voltage distribution of the selected memory cells may change from the erase state $E_0$ to the erase state $E_{IS}$ and the intermediate program state $P_{IS}$. Since step S100 of FIG. 12 is substantially the same as step S100 of FIG. 7, a description thereof will be omitted.

In addition, at step S210, the threshold voltage distribution of the memory cells corresponding to the intermediate program state $P_{IS}$ may be changed to the upper target program states PV4 to PV7. The verify voltages VRF4 to VRF7 in the first group may be used. The verify voltages VRF4 to VRF7 in the first group may correspond to the upper target program states PV4 to PV7, respectively. At step S210, a fine programming operation may be performed on memory cells corresponding to the upper target program states PV4 to PV7 among the entirety of the target program states PV1 to PV7. Therefore, step S210 may be referred to as a first fine programming operation. Step S210 will be described below with reference to FIGS. 13 and 15.

At step S230, the threshold voltage distribution of the memory cells corresponding to the erase state $E_{IS}$ may be changed to the erase state E and the lower target program states PV1 to PV3. The verify voltages VRF1 to VRF3 in the second group may be used. The verify voltages VRF1 to VRF3 in the second group may correspond to the lower target program states PV1 to PV3, respectively. At step S230, a fine programming operation may be performed on memory cells corresponding to the lower target program states PV1 to PV3 among the entirety of the target program states PV1 to PV7. Therefore, step S230 may be referred to as a second fine programming operation. Step S230 will be described below with reference to FIGS. 14 and 15.

Figure 13:
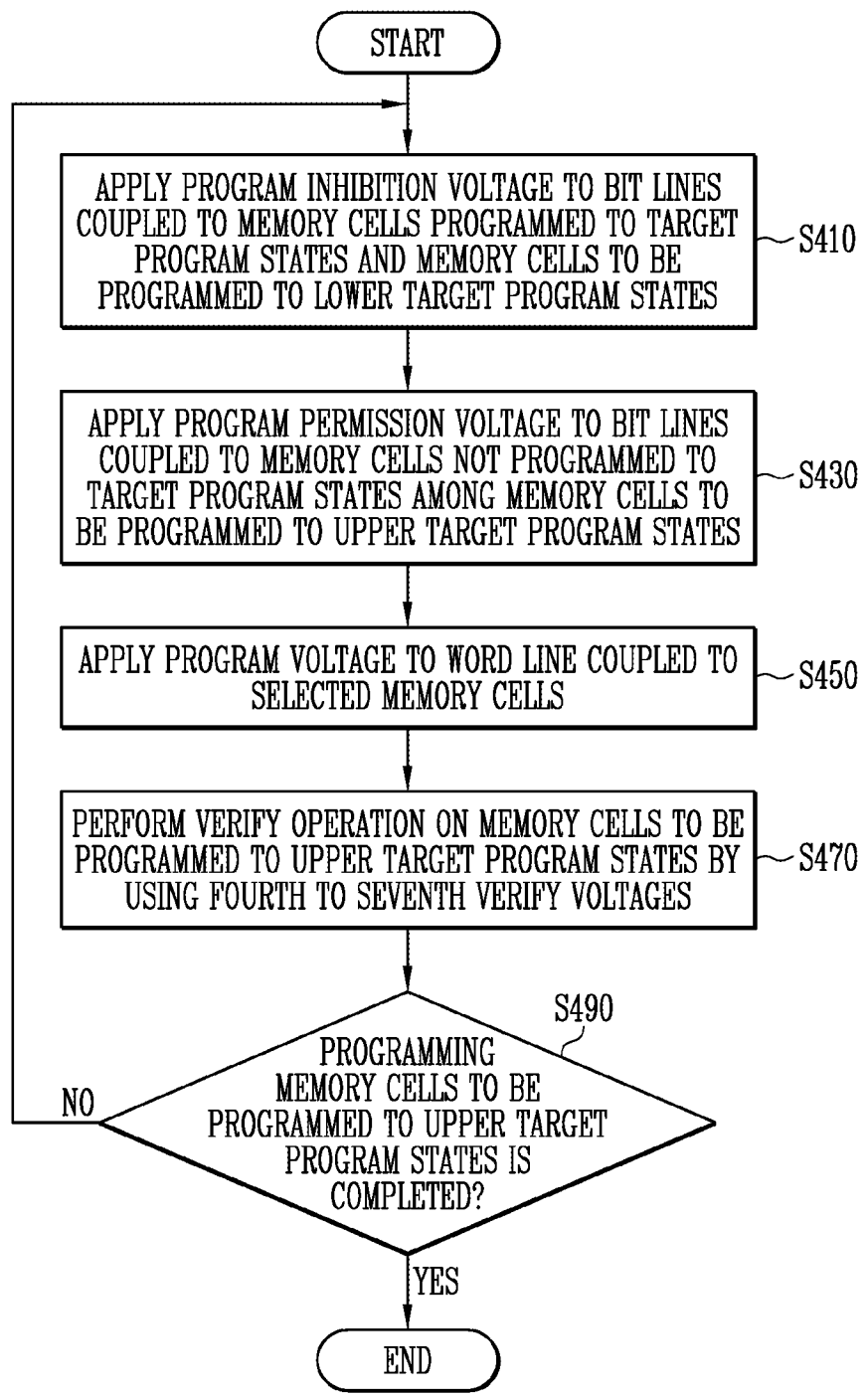
FIG. 13 is a flowchart illustrating an embodiment of step S210 shown in FIG. 12.
Figure 14:
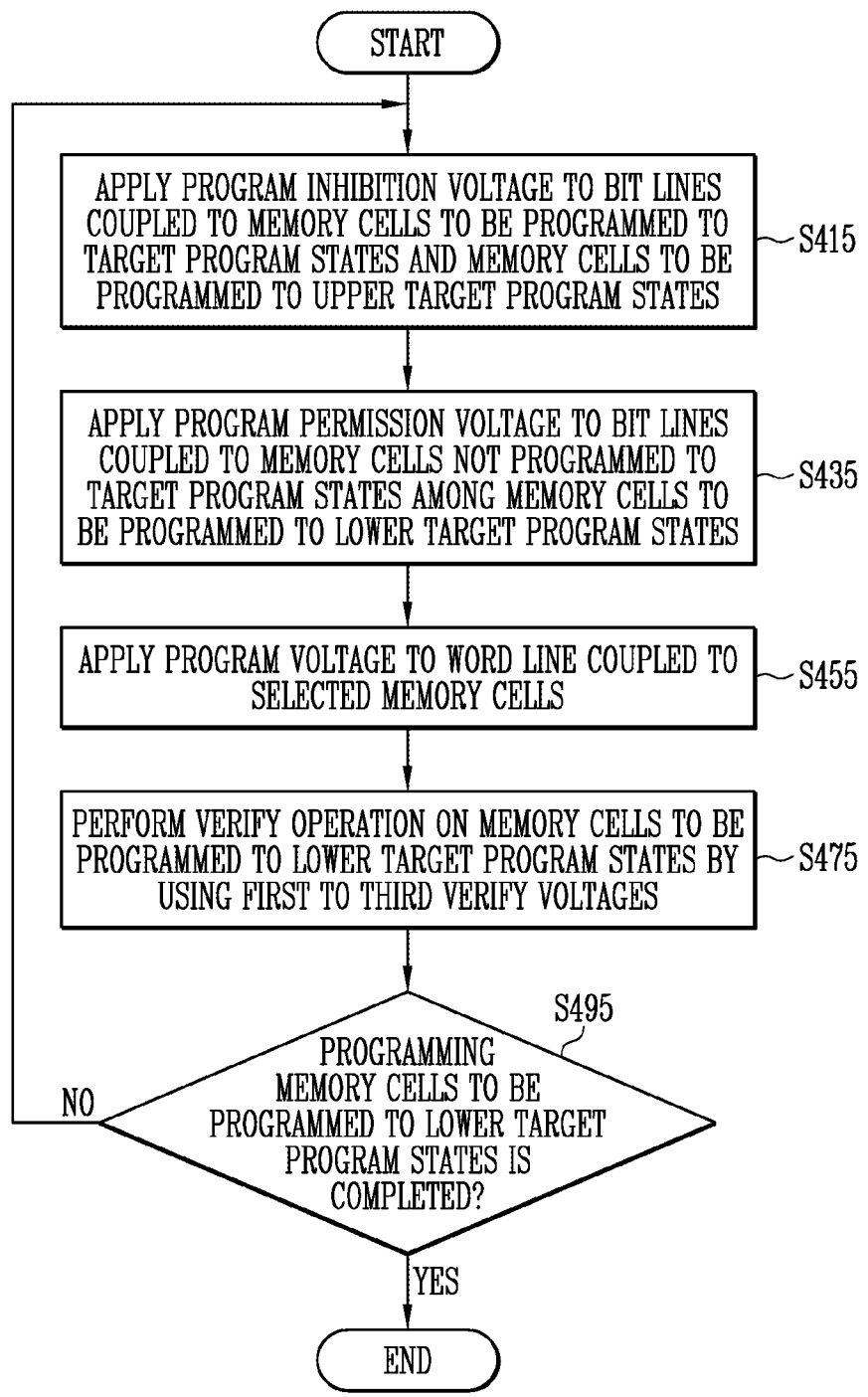
FIG. 14 is a flowchart illustrating an embodiment of step S230 shown in FIG. 12.
Figure 15:
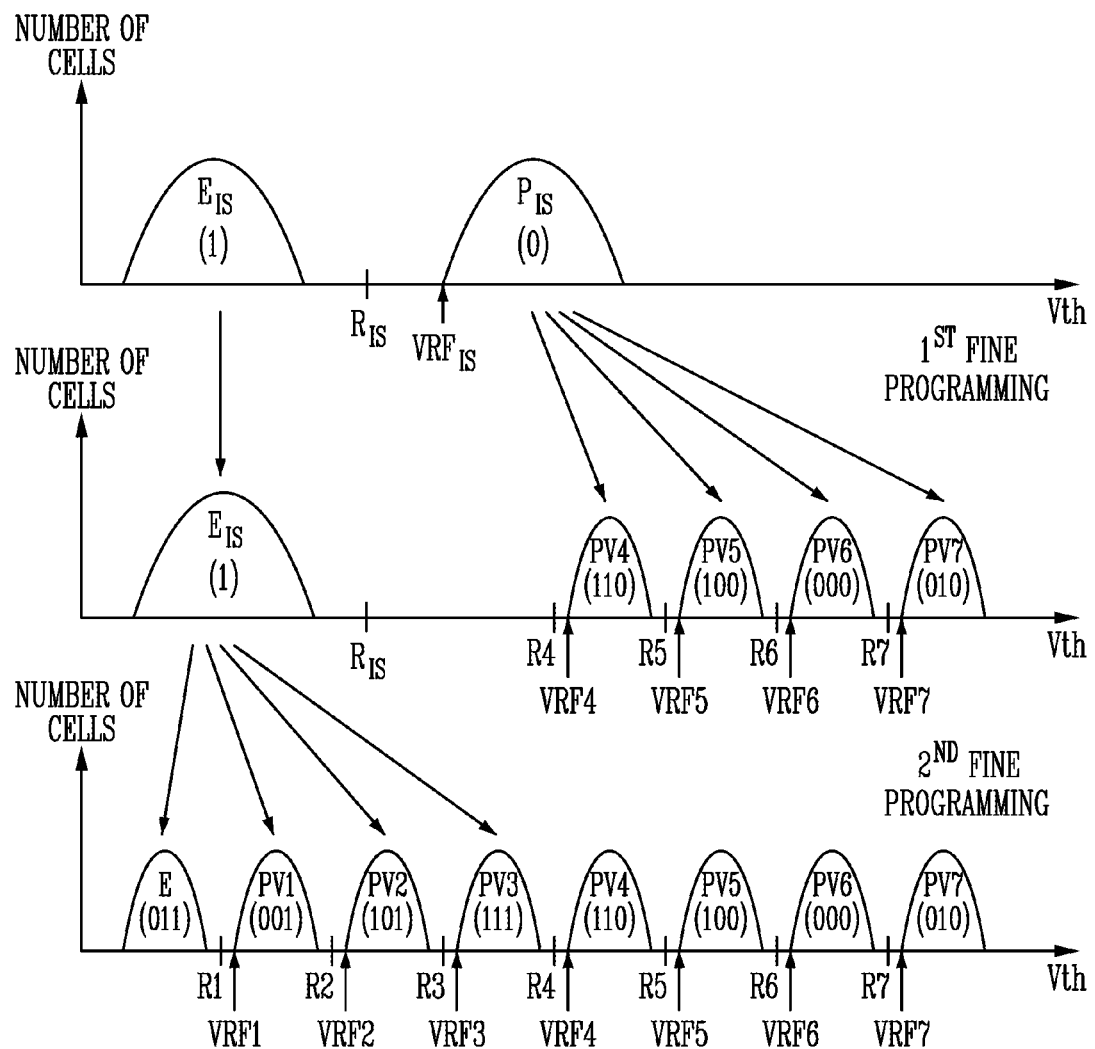
FIG. 15 is a diagram illustrating a threshold voltage distribution of selected memory cells when a program operation is performed according to a method shown in FIGS. 12, 13, and 14.

FIG. 13 is a flowchart illustrating an embodiment of step S210 shown in FIG. 12. FIG. 14 is a flowchart illustrating an embodiment of step S230 shown in FIG. 12. FIG. 15 is a diagram illustrating a threshold voltage distribution of selected memory cells when a program operation is performed according to a method shown in FIGS. 12 to 14.

Hereinafter, step S210 of FIG. 12 is described with reference to FIGS. 13 and 15.

Referring to FIG. 13, step 210 may include applying a program inhibition voltage to bit lines coupled to the memory cells programmed to the target program states PV1 to PV7 and memory cells to be programmed to the lower program states PV1 to PV3 (S410), applying a program permission voltage to bit lines coupled to memory cells not programmed to corresponding target program states among memory cells to be programmed to the upper target program states PV4 to PV7 (S430), applying a program voltage to a word line coupled to selected memory cells (S450), performing a verify operation on the memory cells to be programmed to the upper target program states PV4 to PV7 using the fourth to seventh verify voltages VRF4 to VRF7 (S470), and determining whether programming the memory cells to be programmed to the upper target program states PV4 to PV7 is completed (S490).

As shown in FIG. 15, in the first fine programming operation, steps S410, S430, S450, and S470 may be repeated until the memory cells to be programmed to the upper target program states PV4 to PV7 are completely programmed. In other words, the first fine programming operation of the selected memory cells may include a plurality of program loops. Each of the program loops may include steps S410, S430, S450, and S470.

At step S410, as a result of performing a verify operation in the previous program loop at step S470, a program inhibition voltage may be applied to each of the bit lines coupled to the memory cells completely programmed to the target program states and memory cells to be programmed to the lower target program states PV1 to PV3. In addition, the program inhibition voltage may be applied to each of the bit lines coupled to memory cells which are to maintain the erase state E. In the first fine programming operation, a programming operation might not be performed on the memory cells to be programmed to the lower target program states PV1 to PV3. Therefore, the memory cells to be programmed to the lower target program states PV1 to PV3 may all be program-inhibited cells. Consequently, the program inhibition voltage may be applied to the bit lines coupled to the memory cells corresponding to the erase state E and the lower third target program states PV1 to PV3, and the program inhibition voltage may be applied to the bit lines coupled to the memory cells having verify-passed during the verification in the previous program loop among the memory cells corresponding to the upper target program states PV4 to PV7.

At step S430, a program permission voltage may be applied to each of the bit lines coupled to memory cells which are not completely programmed, among the memory cells to be programmed to the upper target program states PV4 to PV7, as the result of performing the verify operation in the previous program loop at step S470.

FIG. 13 shows that step S430 is performed after step S410. However, the present disclosure is not limited thereto. Steps S410 and S430 may be related to bit line voltage setting for program cells and program-inhibited cells. Therefore, step S410 may be performed after step S430, or steps S410 and S430 may be performed at the same time.

Subsequently, at step S450, a program voltage may be applied to a word line coupled to selected memory cells. Therefore, threshold voltages of program cells, among the selected memory cells, may be increased, whereas threshold voltages of program-inhibited cells might not be increased.

At step S470, a verify operation may be performed on the memory cells to be programmed to the upper target program states PV4 to PV7, among the selected memory cells, by using the fourth to seventh verify voltages VRF4 to VRF7.

At step S490, it may be determined whether all memory cells corresponding to the upper target program states PV4 to PV7, among the selected memory cells, have been completely programmed. Step S210 may end when threshold voltages of all memory cells corresponding to the upper target program states PV4 to PV7 are greater than the verify voltages VRF4, VRF5, VRF6, and VRF7 (S490: YES). On the other hand, when threshold voltages of some of the memory cells corresponding to the upper target program states PV4 to PV7 are smaller than the corresponding verify voltages (S490: NO), the process flow may proceed to step S410 and a subsequent program loop may be repeated.

As the first fine programming operation is performed according to the steps of FIG. 13, the threshold voltage distribution of the intermediate program state $P_{IS}$ may be changed to the fourth to seventh target program states PV4 to PV7 as shown in FIG. 15. During the first fine programming operation, the threshold voltages of the memory cells corresponding to the erase state $E_{IS}$ may be maintained.

Therefore, even when the SPO occurs during the first fine programming operation, the LSB of the selected memory cells may be read through the LSB read operation using the intermediate read voltage $R_{IS}$.

Hereinafter, step S230 of FIG. 12 is described with reference to FIGS. 14 and 15.

Referring to FIG. 14, step 230 may include applying a program inhibition voltage to bit lines coupled to memory cells programmed to the target program states PV1 to PV7 and memory cells to be programmed to the upper program states PV4 to PV7 (S415), applying a program permission voltage to bit lines coupled to memory cells not programmed to corresponding target program states among memory cells to be programmed to the lower target program states PV1 to PV3 (S435), applying a program voltage to a word line coupled to selected memory cells (S455), performing a verify operation on the memory cells to be programmed to the lower target program states PV1 to PV3 using the first to third verify voltages VRF1 to VRF3 (S475), and determining whether programming the memory cells to be programmed to the lower program states PV1 to PV3 is completed (S495).

As shown in FIG. 15, in the second fine programming operation, steps S415, S435, S455, and S475 may be repeated until the memory cells to be programmed to the lower target program states PV1 to PV3 are completely programmed. In other words, the second fine programming operation of the selected memory cells may include a plurality of program loops. Each of the program loops may include steps S415, S435, S455, and S475.

At step S415, as a result of performing a verify operation in the previous program loop at step S475, a program inhibition voltage may be applied to each of the bit lines coupled to the memory cells completely programmed to the target program states and memory cells to be programmed to the upper target program states PV4 to PV7. As a result of the first fine programming operation which is previously performed at step S210, the memory cells corresponding to the upper target program states PV4 to PV7 may be completely programmed. In addition, the program inhibition voltage may be applied to each of the bit lines coupled to memory cells which are to maintain the erase state E at step S415. Consequently, the program inhibition voltage may be applied to the bit lines coupled to the memory cells corresponding to the erase state E and the upper target program states PV4 to PV7, and the program inhibition voltage may be applied to the bit lines coupled to memory cells having verify-passed during the verification in the previous program loop among the memory cells corresponding to the lower target program states PV1 to PV3.

At step S435, a program permission voltage may be applied to each of the bit lines coupled to memory cells which are not completely programmed, among the memory cells to be programmed to the lower target program states PV1 to PV3, as the result of performing the verify operation in the previous program loop at step S475.

FIG. 14 shows that step S435 is performed after step S415. However, the present disclosure is not limited thereto. Steps S415 and S435 may be related to bit line voltage setting for program cells and program-inhibited cells. Therefore, step S415 may be performed after step S435, or steps S415 and S435 may be performed at the same time.

Subsequently, at step S455, a program voltage may be applied to a word line coupled to selected memory cells. Therefore, threshold voltages of program cells, among the selected memory cells, may be increased, whereas threshold voltages of program-inhibited cells might not be increased.

At step S475, a verify operation may be performed on the memory cells to be programmed to the lower target program states PV1 to PV3, among the selected memory cells, by using the first to third verify voltages VRF1 to VRF3.

At step S495, it may be determined whether programming memory cells corresponding to the lower target program states PV1 to PV3, among the selected memory cells, is completed. Step S230 may end when threshold voltages of all memory cells corresponding to the lower target program states PV1, PV2, and PV3 are greater than the verify voltages VRF1, VRF2, and VRF3 (S495: YES). On the other hand, when threshold voltages of some of the memory cells corresponding to the lower target program states PV1 to PV3 are less than the corresponding verify voltages (S495: NO), the process flow may proceed to step S415 and a subsequent program loop may be repeated.

As the second fine programming operation is performed according to the steps of FIG. 14, the threshold voltage distribution corresponding to the erase state $E_{IS}$ may be changed to the erase state E and the first to third target program states PV1 to PV3 as shown in FIG. 15. During the second fine programming operation, the threshold voltages of the memory cells programmed to the fourth to seventh target program states PV4 to PV7 may be maintained.

Therefore, even when the SPO occurs during the second fine programming operation, the LSB of the selected memory cells may be read through the LSB read operation using the fourth read voltage R4.

According to the embodiment described above with reference to FIGS. 12 to 15, after the foggy programming operation is performed on the selected memory cells, when the SPO occurs during the first fine programming operation or the second fine programming operation, the LSB of the selected memory cells may be normally read using the intermediate read voltage $R_{IS}$ or the fourth read voltage R4.

Figure 16:
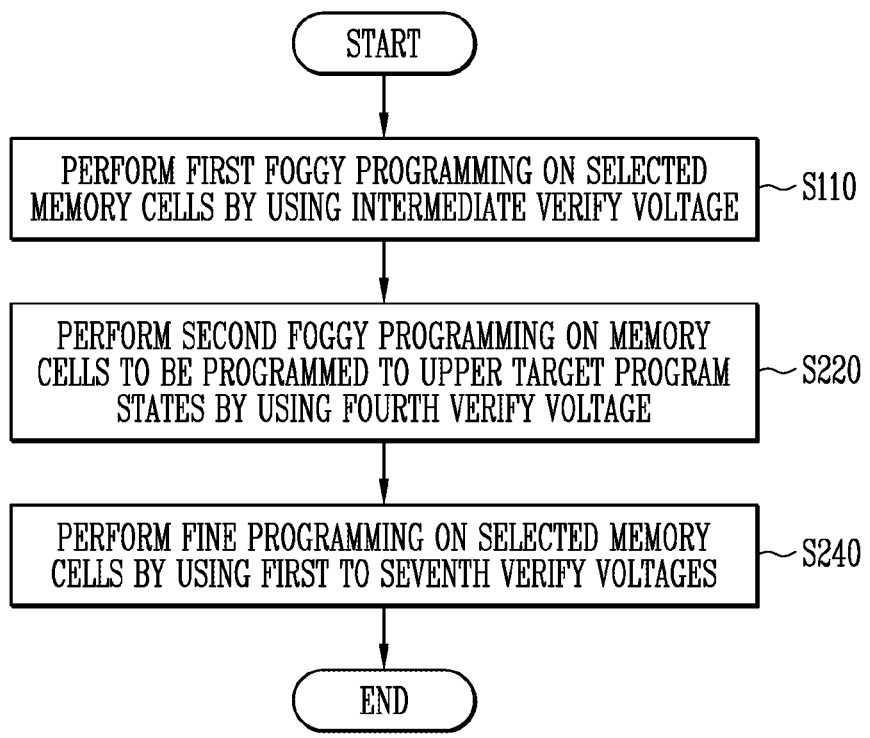
FIG. 16 is a flowchart illustrating a method of operating a semiconductor memory device according to another embodiment of the present disclosure.

FIG. 16 is a flowchart illustrating a method of operating a semiconductor memory device according to another embodiment of the present disclosure.

Referring to FIG. 16, a method of operating a semiconductor memory device according to an embodiment of the present disclosure may include a first foggy programming operation on selected memory cells using the intermediate verify voltage $VRF_{IS}$ (S110), performing a second foggy programming operation on memory cells to be programmed to the upper target program states PV4 to PV7 by using the fourth verify voltage VRF4 (S220), and performing a fine programming operation on the selected memory cells using the first to seventh verify voltages VRF1 to VRF7 (S240).

At step S110, a threshold voltage distribution of the selected memory cells may change from the erase state $E_0$ to the erase state $E_{IS}$ and a first intermediate program state $P_{IS}$. Since step S110 of FIG. 16 is substantially the same as step S100 of FIG. 7 or 12, a description thereof will be omitted.

At step S220, the threshold voltage distribution of the memory cells corresponding to the first intermediate program state $P_{IS}$ may be changed to a second intermediate program state $P_{IS}'$. The threshold voltages of the memory cells in the first intermediate program state $P_{IS}$ may be greater than the intermediate verify voltage $VRF_{IS}$ and the threshold voltages of the memory cells in the second intermediate program state $P_{IS}'$ may be greater than the fourth verify voltage VRF4. The threshold voltage distribution of the memory cells in the erase state $E_{IS}$ may maintain an erase state $E_{IS}'$ even when step S220 is performed.

According to an embodiment, only the fourth verify voltage VRF4 may be used at step S220. A verify operation using the fourth verify voltage may be performed at a time on the memory cells to be programmed to the fourth to seventh target program states. In other words, the verify operation using the fourth verify voltage may be performed on the memory cells to be programmed to the fifth to seventh target program states as well as the memory cells to be programmed to the fourth target program state.

According to another embodiment, the verify voltages VRF4 to VRF7 in the first group, including the fourth verify voltage VRF4, may be used at step S220. A verify voltage corresponding to each of the memory cells to be programmed to the fourth to seventh target program states may be applied. In other words, a verify operation using the fourth verify voltage VRF4 may be performed on the memory cells to be programmed to the fourth target program states PV4, a verify operation using the fifth verify voltage VRF5 may be performed on the memory cells to be programmed to the fifth target program state PV5, a verify operation using the sixth verify voltage VRF6 may be performed on the memory cells to be programmed to the sixth target program state PV6, and a verify operation using the seventh verify voltage VRF7 may be performed on the memory cells to be programmed to the seventh target program state PV7. Step S220 will be described below with reference to FIGS. 17 and 19.

At step S240, the threshold voltage distribution of the memory cells in the erase state $E_{IS}$ may be changed to the erase state E and the lower target program states PV1 to PV3, and the threshold voltage distribution of the memory cells in the second intermediate program state $P_{IS}'$ may be changed to the fourth to seventh target program states PV4 to PV7. The first to seventh verify voltages VRF1 to VRF7 may be used. The verify voltages in the second group may correspond to the lower target program states PV1 to PV3. At step S240, a fine program operation may be performed on the selected memory cells. Step S240 will be described below with reference to FIGS. 18 and 19.

Figure 17:
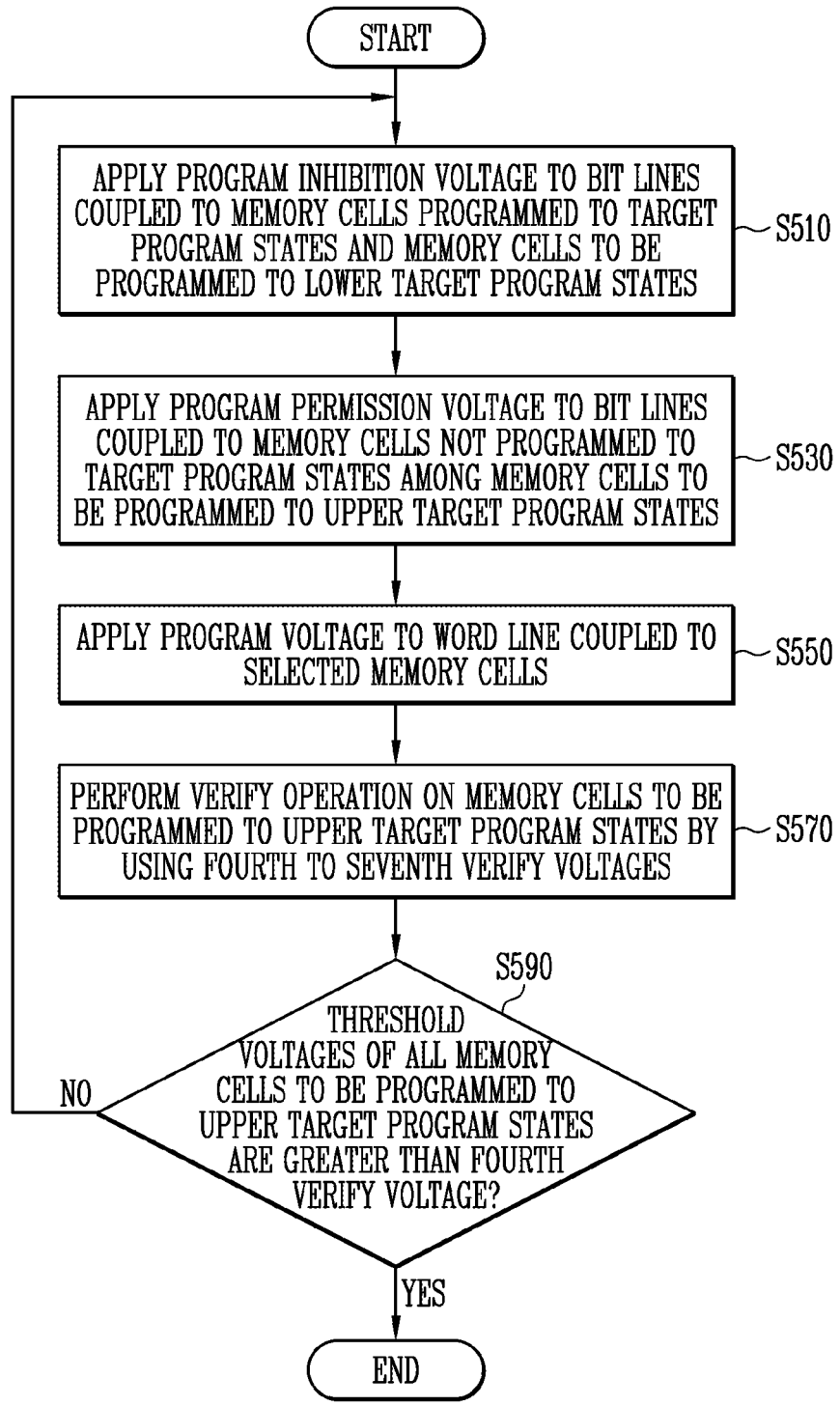
FIG. 17 is a flowchart illustrating an embodiment of step S220 shown in FIG. 16.
Figure 18:
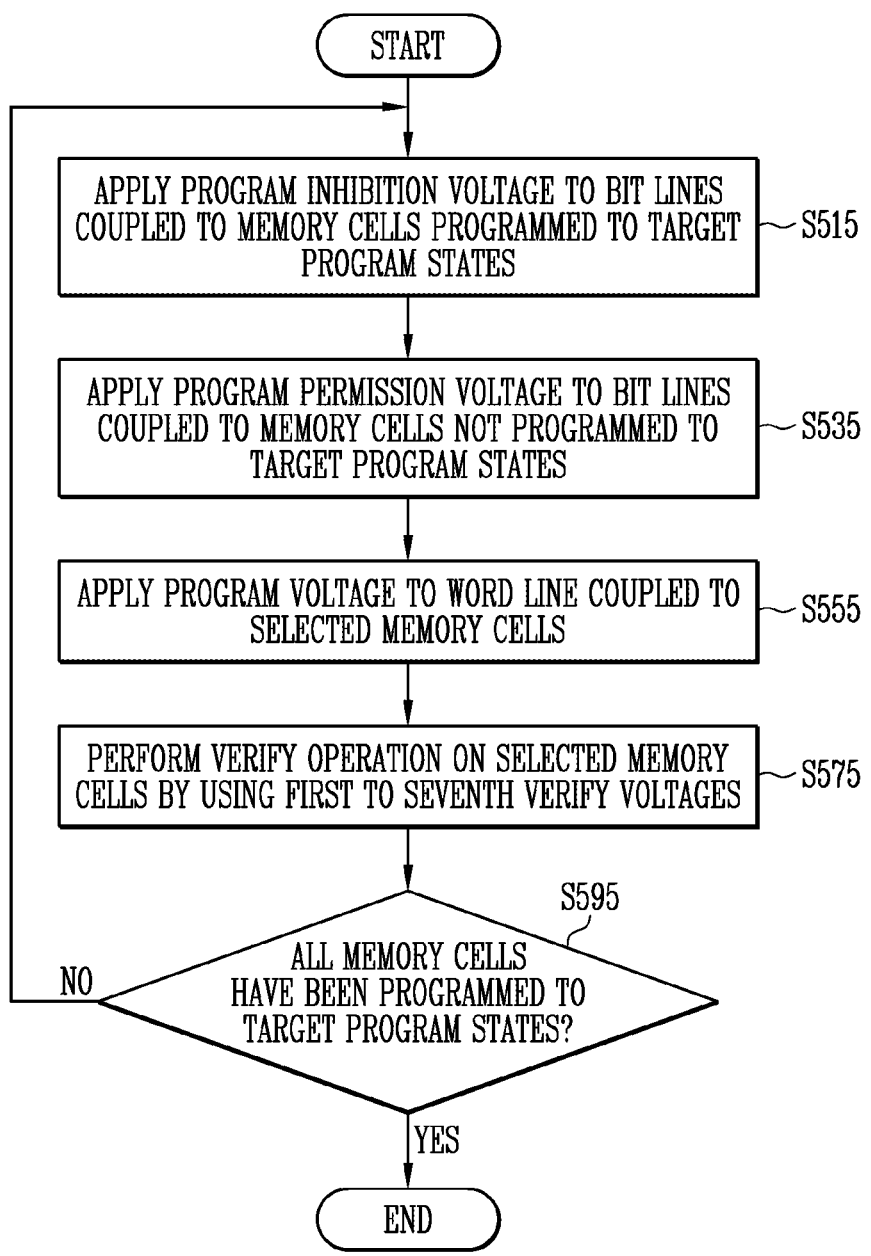
FIG. 18 is a flowchart illustrating an embodiment of step S240 shown in FIG. 16.
Figure 19:
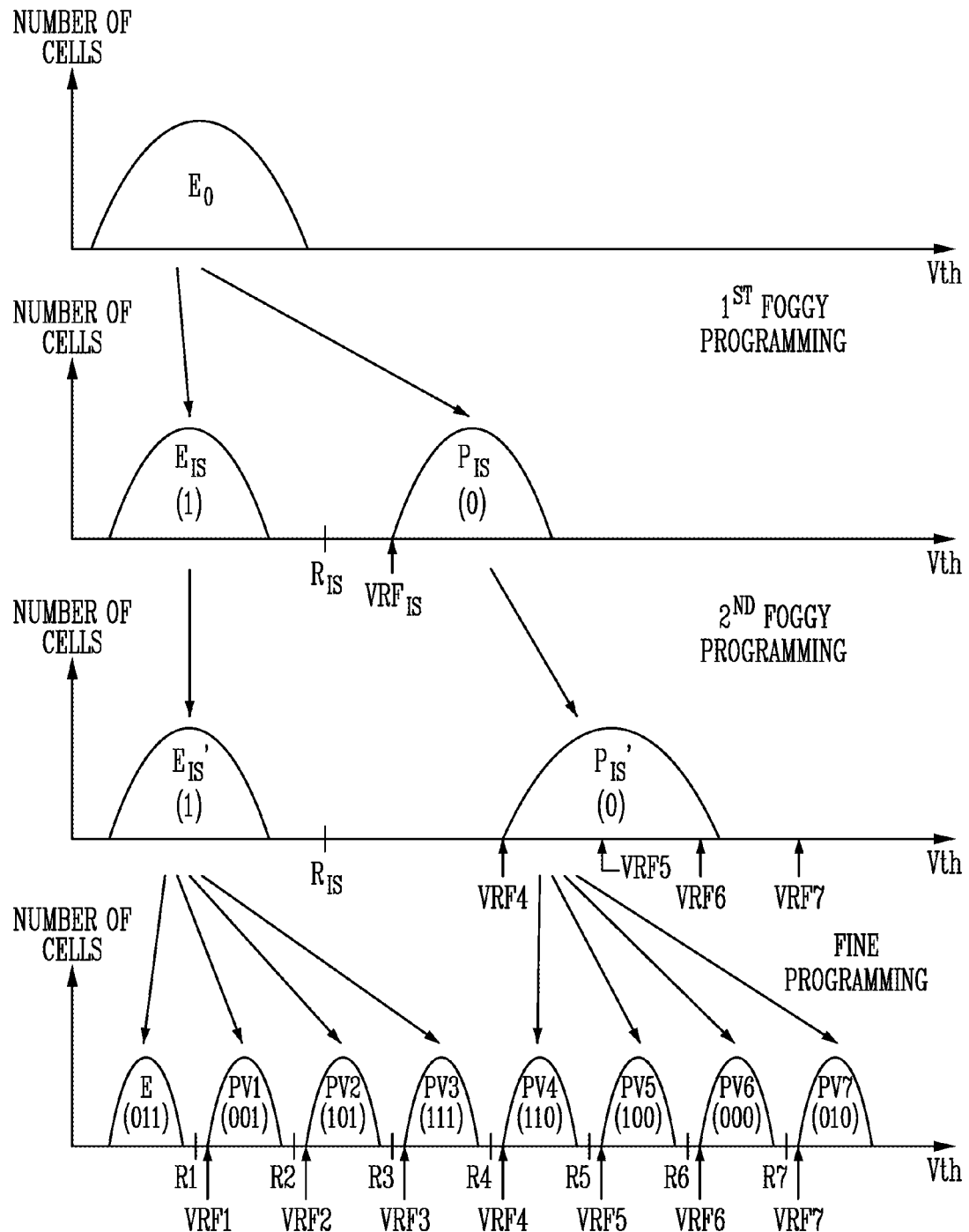
FIG. 19 is a diagram illustrating a threshold voltage distribution of selected memory cells when a program operation is performed according to a method shown in FIGS. 16, 17, and 18.

FIG. 17 is a flowchart illustrating an embodiment of step S220 shown in FIG. 16. FIG. 18 is a flowchart illustrating an embodiment of step S240 shown in FIG. 16. FIG. 19 is a diagram illustrating a threshold voltage distribution of selected memory cells when a program operation is performed according to a method shown in FIGS. 16 to 18.

Hereinafter, step S220 of FIG. 16 is described with reference to FIGS. 17 and 19.

Referring to FIG. 17, step 220 may include applying a program inhibition voltage to bit lines coupled to memory cells programmed to the target program states PV1 to PV7 and memory cells to be programmed to the lower program states PV1 to PV3 (S510), applying a program permission voltage to bit lines coupled to memory cells not programmed to corresponding target program states among memory cells to be programmed to the upper target program states PV4 to PV7 (S530), applying a program voltage to a word line coupled to selected memory cells (S550), performing a verify operation on the memory cells to be programmed to the upper target program states PV4 to PV7 using the fourth to seventh verify voltages VRF4 to VRF7 (S570), and determining whether threshold voltages of all memory cells to be programmed to the upper target program states PV4 to PV7 are greater than the fourth verify voltage VRF4 (S590).

At step S510, as a result of performing a verify operation in the previous program loop at step S570, a program inhibition voltage may be applied to each of the bit lines coupled to the memory cells completely programmed to the target program states and memory cells to be programmed to the lower target program states PV1 to PV3. In addition, the program inhibition voltage may be applied to each of the bit lines coupled to memory cells which are to maintain the erase state E at step S510. Consequently, the program inhibition voltage may be applied to the bit lines coupled to the memory cells corresponding to the erase state E and the lower third target program states PV1 to PV3, and the program inhibition voltage may be applied to the bit lines coupled to memory cells having verify-passed during the verification in the previous program loop among the memory cells corresponding to the upper target program states PV4 to PV7.

At step S530, a program permission voltage may be applied to each of the bit lines coupled to memory cells which are not completely programmed, among the memory cells to be programmed to the upper target program states PV4 to PV7 as the result of performing the verify operation in the previous program loop at step S570.

Subsequently, at step S550, a program voltage may be applied to a word line coupled to selected memory cells. Therefore, threshold voltages of program cells, among the selected memory cells, may be increased, whereas threshold voltages of program-inhibited cells might not be increased.

At step S570, a verify operation may be performed on the memory cells to be programmed to the upper target program states PV4 to PV7, among the selected memory cells, by using the fourth to seventh verify voltages VRF4 to VRF7.

At step S590, it may be determined whether the threshold voltages of the memory cells corresponding to the upper target program states PV4 to PV7, among the selected memory cells, are greater than the fourth verify voltage. Step S220 may end when threshold voltages of all memory cells corresponding to the upper target program states PV4 to PV7 are greater than the fourth verify voltage VRF4 (S590: YES). In other words, although the verification of the memory cells to be programmed to the fifth to seventh target program states does not pass, step S220 may end when the threshold voltages of the memory cells corresponding to the upper target program states PV4 to PV7 are greater than the fourth verify voltage VRF4. According to an embodiment, when the memory cells to be programmed to the fourth target program state are completely programmed, the threshold voltages of the memory cells to be programmed to the upper target program states are greater than the fourth verify voltage.

On the other hand, when threshold voltages of some of the memory cells corresponding to the upper target program states PV4 to PV7 are smaller than the fourth verify voltage VRF4 (S590: NO), the process flow may proceed to step S510 and a subsequent program loop may be repeated.

As the second foggy programming operation is performed according to the steps of FIG. 17, the threshold voltage distribution of the first intermediate program state $P_{IS}$ may be changed to the second intermediate program state $P_{IS}'$ as shown in FIG. 19. During the second foggy programming operation, the threshold voltages of the memory cells corresponding to the erase state $E_{IS}$ may be maintained.

Therefore, even when the SPO occurs during the second fine programming operation, the LSB of the selected memory cells may be read through the LSB read operation using the intermediate read voltage $R_{IS}$.

Hereinafter, step S240 of FIG. 16 is described with reference to FIGS. 18 and 19.

Referring to FIG. 18, step S240 may include applying a program inhibition voltage to bit lines coupled to memory cells programmed to the target program states PV1 to PV7 (S515), applying a program permission voltage to bit lines coupled to memory cells not programmed to the target program states PV1 to PV7 (S535), applying a program voltage to a word line coupled to selected memory cells (S555), performing a verify operation on the selected memory cells using first to seventh verify voltages VRF1 to VRF7 (S575), and determining whether the selected memory cells are programmed to the target program states PV1 to PV7 (S595).

As shown in FIG. 19, steps S515, S535, S555, and S575 may be repeated until programming the selected memory cells to the target program states is completed. In other words, a fine programming operation of the selected memory cells may include a plurality of program loops. Each of the program loops may include steps S515, S535, S555, and S575. Steps S515, S535, S555, and S575 of FIG. 18 may be substantially the same as steps S315, S335, S355, and S375 of FIG. 9, respectively. Therefore, overlapping descriptions of steps S515, S535, S555, and S575 of FIG. 18 will be omitted.

As the fine programming operation is performed according to the steps of FIG. 18, the threshold voltage distribution of the erase state $E_{IS}'$ and the second intermediate program state $P_{IS}'$ may be changed to the erase state E and the first to seventh target program states PV1 to PV7. More specifically, the threshold voltage distribution of the memory cells corresponding to the erase state $E_{IS}'$ may be changed to the erase state E and the first to third target program states PV1 to PV3, and the threshold voltage distribution of the intermediate program state $P_{IS}'$ may be changed to the fourth to seventh target program states PV4 to PV7. Therefore, even when the SPO occurs during the fine programming operation, the LSB of the selected memory cells may be read through the LSB read operation using the fourth read voltage R4.

According to the embodiment described above with reference to FIGS. 16 to 19, after the first foggy programming operation is performed on the selected memory cells, when the SPO occurs during the second foggy programming operation or the fine programming operation, the LSB of the selected memory cells may be normally read using the intermediate read voltage $R_{IS}$ or the fourth read voltage R4.

Figure 20:
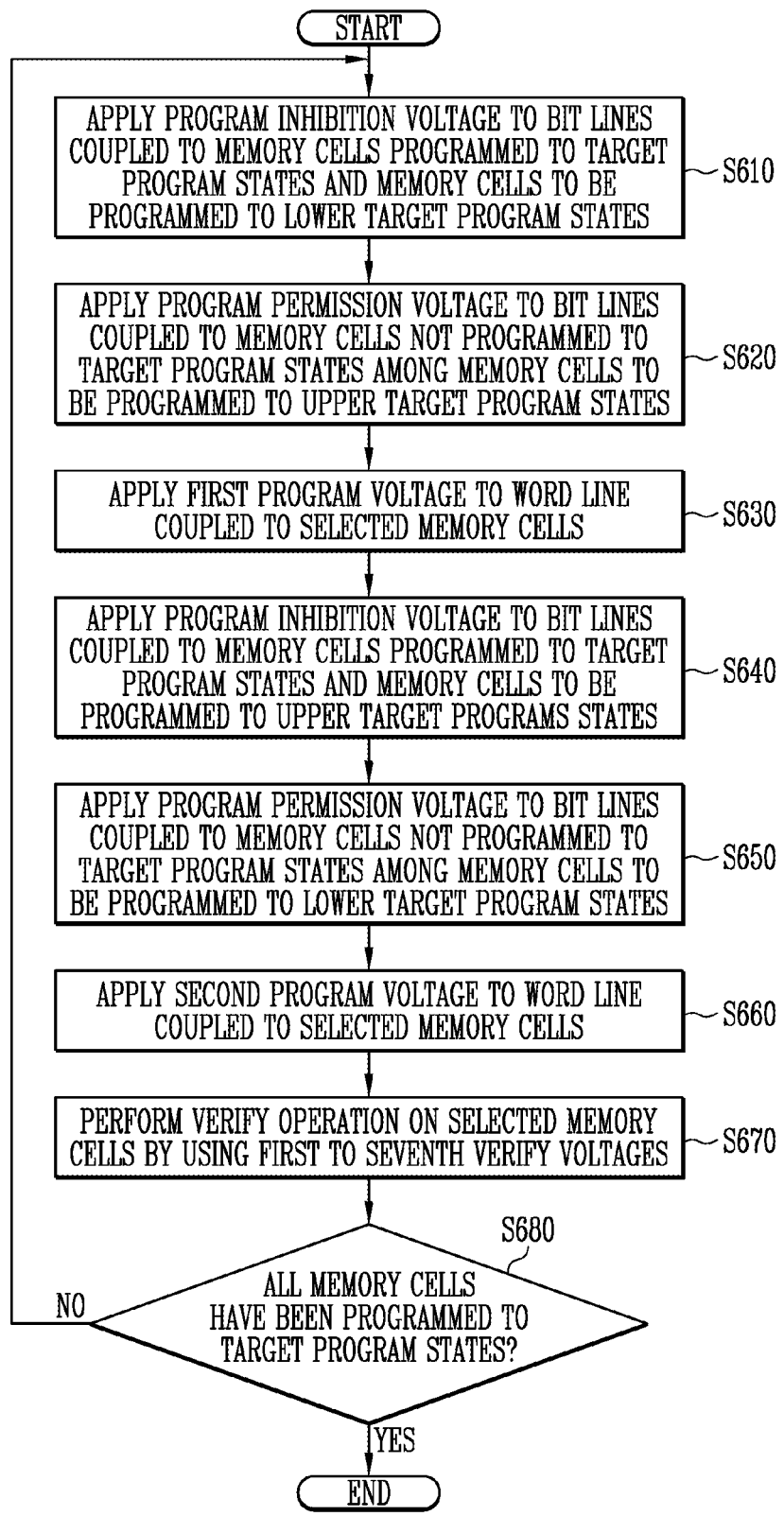
FIG. 20 is a flowchart illustrating another embodiment of step S200 of FIG. 7.

FIG. 20 is a flowchart illustrating another embodiment of step S200 of FIG. 7.

Referring to FIG. 20, step S200 of FIG. 7 may include applying a program inhibition voltage to bit lines coupled to memory cells programmed to target program states and memory cells to be programmed to lower target program states (S610), applying a program permission voltage to a bit line coupled memory cells not programmed to the target program states, among memory cells to be programmed to upper target program states (S620), applying a first program voltage to a word line coupled to selected memory cells (S630), applying the program inhibition voltage to the bit lines coupled to the memory cells programmed to the target program states and the memory cells to be programmed to the upper target program states (S640), applying the program permission voltage to the bit line coupled to the memory cells not programmed to the target program states, among the memory cells to be programmed to the lower target program states (S650), applying a second program voltage to the word line coupled to the selected memory cells (S660), performing a verify operation on the selected memory cells (S670), and determining whether all memory cells have been programmed to the target program states (S680).

At step S610, the program inhibition voltage may be applied to the bit lines coupled to the memory cells to be programmed to the lower target program states PV1 to PV3. In addition, the program inhibition voltage may be applied to the bit lines coupled to memory cells which maintain the erase state E at step S610. At step S610, the program inhibition voltage may be applied to the bit lines coupled to the completely programmed memory cells as a result of performing the verify operation in the previous program loop at step S670 among the memory cells to be programmed to the upper target program states PV4 to PV7.

At step S620, the program inhibition voltage may be applied to the bit lines coupled to memory cells which are not completely programmed as the result of the verify operation in the previous program loop at step S670 among the memory cells to be programmed to the upper target program states PV4 to PV7.

At step S630, the first program voltage may be applied to the selected word line. Therefore, only the threshold voltages of the memory cells which are not completely programmed, among the memory cells to be programmed to the upper target program states PV4 to PV7, may be increased.

At step S640, the program inhibition voltage may be applied to the bit lines coupled to the memory cells to be programmed to the upper target program states PV4 to PV7. In addition, the program inhibition voltage may be applied to the bit lines coupled to memory cells which maintain the erase state E at step S640. At step S640, the program inhibition voltage may be applied to the bit lines coupled to the memory cells which are completely programmed, among the memory cells to be programmed to the lower target program states PV1 to PV3, as the result of the verify operation in the previous program loop at step S670.

At step S650, the program permission voltage may be applied to the bit lines coupled to memory cells which are not completely programmed among the memory cells to be programmed to the lower target program states PV1 to PV3 as a result of the verify operation in the previous program loop at step S670.

At step S660, the second program voltage may be applied to the selected word line at step S660. Therefore, only the threshold voltages of the memory cells which are not completely programmed, among the memory cells to be programmed to the lower target program states PV1 to PV3, may be increased. According to an embodiment, the second program voltage which is applied to the selected word line at step S660 may have substantially the same magnitude as the first program voltage which is applied to the selected word line at step S630. According to another embodiment, the second program voltage which is applied to the selected word line at step S660 may be smaller than the first program voltage which is applied to the selected word line at step S630.

At step S670, a verify operation may be performed on the selected memory cells using the first to seventh verify voltages VRF1 to VRF7.

At step S680, it may be determined whether programming the selected memory cells to the target program states respectively corresponding thereto is completed. When the threshold voltages of all selected memory cells are greater than the corresponding verify voltages (S680: YES), step S200 may end. When threshold voltages of at least some of the selected memory cells are less than the corresponding verify voltages (S680: NO), the process flow may proceed to step S610, and a subsequent program loop may be repeated.

Figure 21:
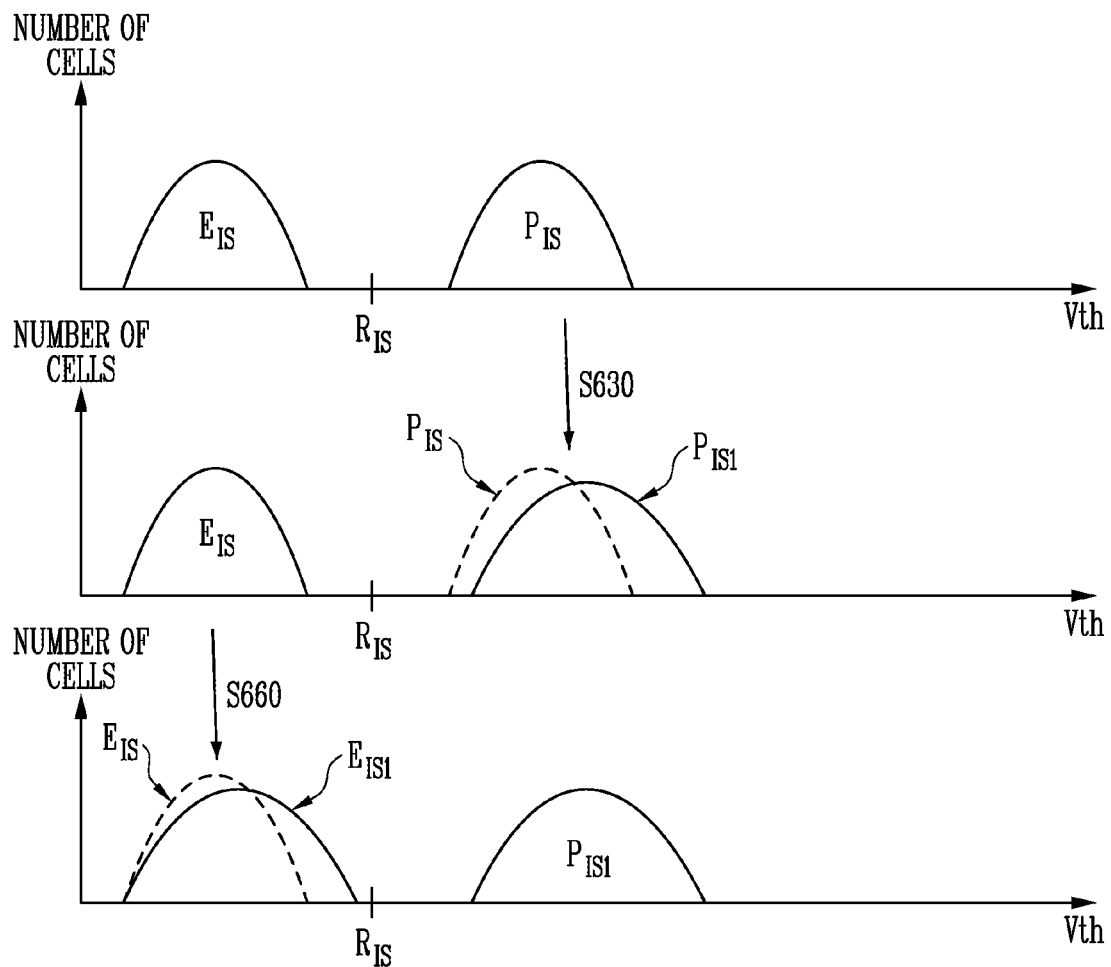
FIG. 21 is a diagram illustrating a threshold voltage distribution of selected memory cells when a program operation is performed according to a method shown in FIGS. 7, 8, and 20.

FIG. 21 is a diagram illustrating a threshold voltage distribution of selected memory cells when a program operation is performed according to the method shown in FIGS. 7, 8, and 20. More specifically, FIG. 21 shows changes in threshold voltage distribution of selected memory cells in one program loop. Step S200 according to an example of an embodiment of the present disclosure will be described below with reference to FIGS. 20 and 21.

Through steps S610 and S620, the memory cells corresponding to the erase state E and the lower target program states PV1 to PV3 may be program-inhibited cells, and memory cells which are not yet completely programmed, among the memory cells corresponding to the upper target program states PV4 to PV7, may be program cells. Subsequently, when the first program voltage is applied to the selected memory cells at step S630, only the threshold voltage distribution of the memory cells corresponding to the intermediate program state $P_{IS}$ may be changed to an intermediate program state $P_{IS1}$. However, the threshold voltage distribution of the memory cells corresponding to the erase state $E_{IS}$ might not change.

Through steps S640 and S650, the memory cells corresponding to the upper target program states PV4 to PV7 may be program-inhibited cells, and the memory cells which are not yet completely programmed, among the memory cells corresponding to the lower target program states PV1 to PV3, may be program cells. When the second program voltage is applied to the selected memory cells at step S660, only the threshold voltage distribution of the memory cells corresponding to the erase state EIS may be changed to an erase state $E_{IS1}$. However, the threshold voltage distribution of the memory cells corresponding to the intermediate program state $P_{IS1}$ might not change.

As described above, according to an embodiment, the second program voltage which is applied to the selected word line at step S660 may have substantially the same magnitude as the first program voltage which is applied to the selected word line at step S630. According to another embodiment, the second program voltage which is applied to the selected word line at step S660 may be smaller than the first program voltage which is applied to the selected word line at step S630. When the second program voltage is smaller than the first program voltage, a threshold voltage shift width of the memory cells at step S660 may be smaller than that of the memory cells at step S630.

Referring to FIG. 21, during one program loop, the threshold voltages of the memory cells corresponding to the upper target program states PV4 to PV7 may be increased first, and the threshold voltages of the memory cells corresponding to the lower target program states PV1 to PV3 may then be increased. Therefore, even when the SPO occurs during a plurality of program loops at step S200, the LSB read operation may be performed by searching for an optimal read voltage. More specifically, when the SPO occurs during the plurality of program loops at step S200, the LSB read operation may be performed using the intermediate read voltage $R_{IS}$. When an error correction operation on LSB read data using the intermediate read voltage $R_{IS}$ fails, an LSB read operation may be performed using the fourth read voltage R4. When the error correction operation on the LSB read data using the fourth read voltage R4 fails, the LSB read operation may be repeated by determining an arbitrary read voltage between the intermediate read voltage $R_{IS}$ and the fourth read voltage R4. As shown in FIG. 21, when the fine programming operation of FIG. 20 is performed, memory cells corresponding to the hatched area "A" in FIG. 11 might not occur. Therefore, when the LSB read operation is performed using the plurality of read voltage, the LSB data on the selected memory cells may be likely to be normally read.

Figure 22:
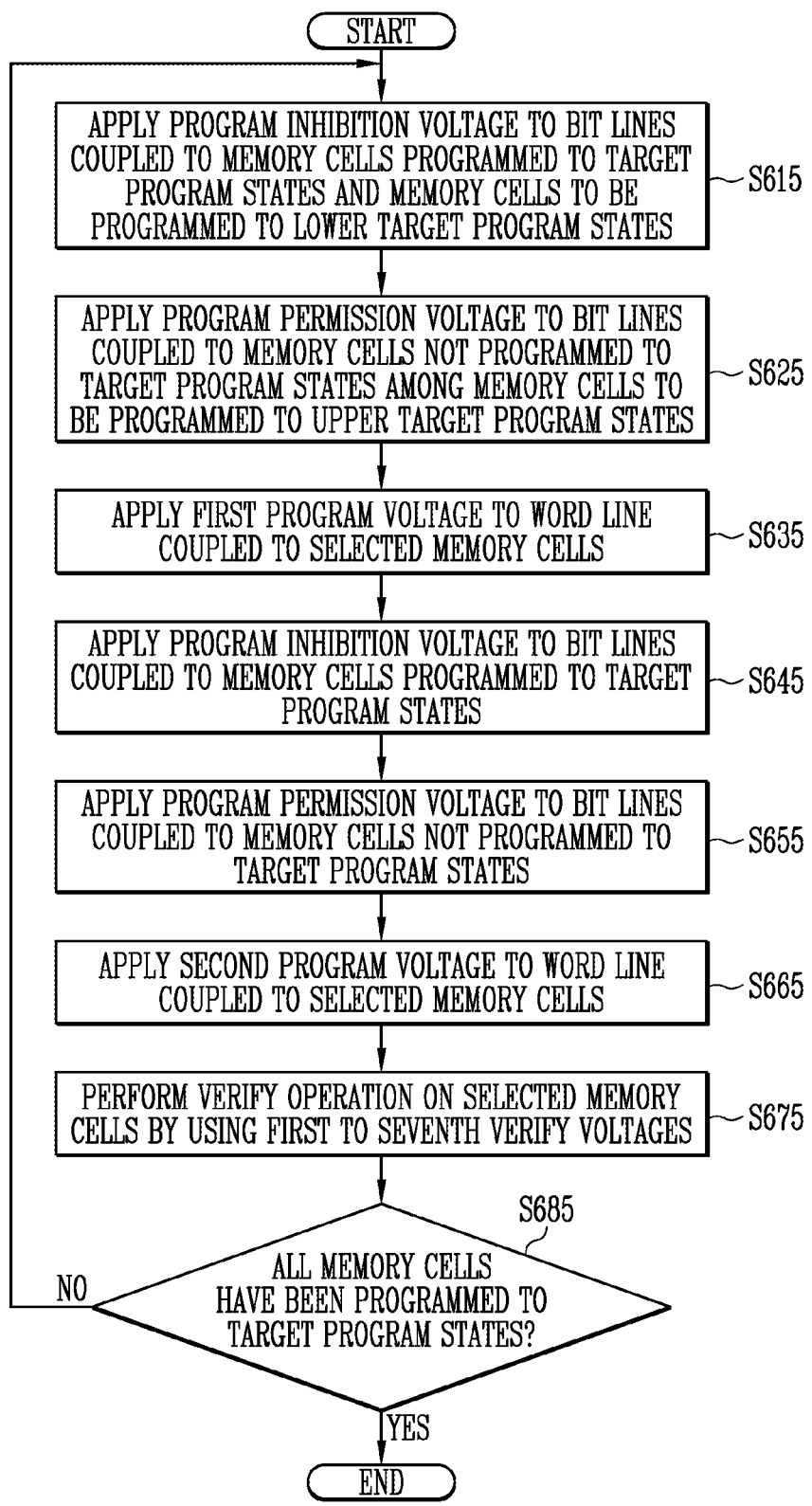
FIG. 22 is a flowchart illustrating another embodiment of step S200 of FIG. 7.

FIG. 22 is a flowchart illustrating another embodiment of step S200 of FIG. 7.

Referring to FIG. 22, step S200 of FIG. 7 may include applying a program inhibition voltage to bit lines coupled to memory cells programmed to target program states and memory cells to be programmed to lower target program states (S615), applying a program permission voltage to a bit line coupled memory cells which are not programmed to the target program states, among memory cells to be programmed to upper target program states (S625), applying a first program voltage to a word line coupled to selected memory cells (S635), applying the program inhibition voltage to the bit lines coupled to the memory cells programmed to the target program states (S645), applying the program permission voltage to the bit line coupled to the memory cells not programmed to the target program states (S655), applying a second program voltage to the word line coupled to the selected memory cells (S665), performing a verify operation on the selected memory cells by using first to seventh verify voltages (S675), and determining whether programming all memory cells to the target program states is completed (S685).

Steps S615, S625, and S635 of FIG. 22 may be substantially the same as steps S610, S620, and S630 of FIG. 20, respectively. Therefore, descriptions of steps S615, S625, and S635 of FIG. 22 will be omitted.

At step S645, a program inhibition voltage may be applied to bit lines coupled to memory cells maintaining the erase state E, and the program inhibition voltage may be applied to bit lines coupled to memory cells which are completely programmed as a result of the verify operation in the previous program loop at step S675.

At step S655, a program permission voltage may be applied to bit lines coupled to memory cells which are not completely programmed as the result of the verify operation at step S670.

At step S665, the second program voltage may be applied to the selected word line. Therefore, only the threshold voltages of the memory cells which are not completely programmed, among the selected memory cells, may be increased. According to an embodiment, the second program voltage which is applied to the selected word line at step S665 may have substantially the same magnitude as the first program voltage which is applied to the selected word line at step S635. According to another embodiment, the second program voltage which is applied to the selected word line at step S665 may be smaller than the first program voltage which is applied to the selected word line at step S635.

At step S675, a verify operation may be performed on the selected memory cells using the first to seventh verify voltages VRF1 to VRF7.

At step S685, it may be determined whether the selected memory cells have been completely programmed to the target program states respectively corresponding thereto. When the threshold voltages of all selected memory cells are greater than the corresponding verify voltages (S685: YES), step S200 may end. When threshold voltages of at least some of the selected memory cells are less than the corresponding verify voltages (S685: NO), the process flow may proceed to step S615, and a subsequent program loop may be repeated.

Figure 23:
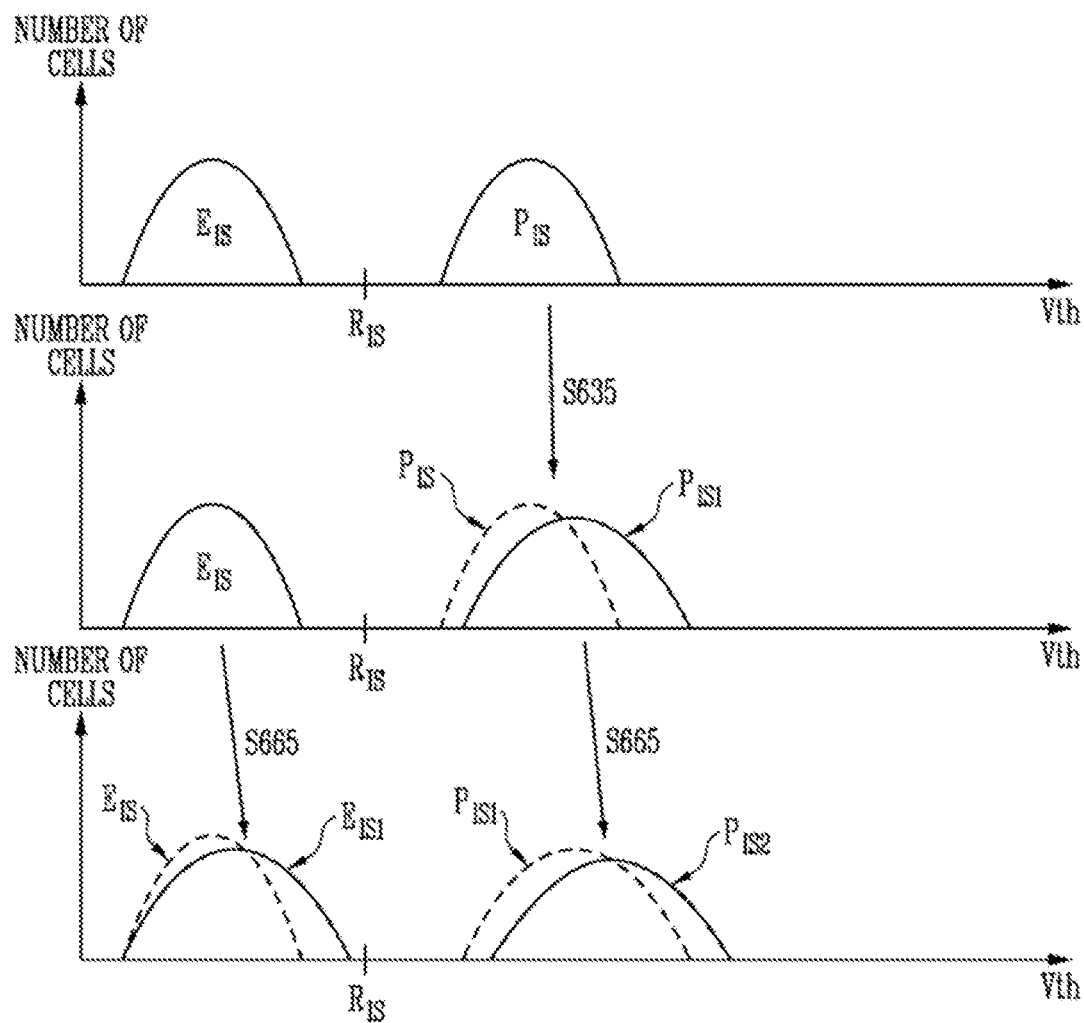
FIG. 23 is a diagram illustrating a threshold voltage distribution of selected memory cells when a program operation is performed according to a method shown in FIGS. 7, 8, and 22.

FIG. 23 is a diagram illustrating a threshold voltage distribution of selected memory cells when a program operation is performed according to the method shown in FIGS. 7, 8, and 22. Step S200 according to an example of an embodiment of the present disclosure will be described below with reference to FIGS. 22 and 23.

Through steps S615 and S625, the memory cells corresponding to the erase state E and the lower target program states PV1 to PV3 may be program-inhibited cells, and memory cells which are not yet completely programmed, among the memory cells corresponding to the upper target program states PV4 to PV7, may be program cells. Subsequently, when the first program voltage is applied to the selected memory cells at step S635, only the threshold voltage distribution of the memory cells corresponding to the intermediate program state $P_{IS}$ may be changed to the intermediate program state $P_{IS1}$. However, the threshold voltage distribution of the memory cells corresponding to the erase state $E_{IS}$ might not change. This may be the same as the embodiment described with reference to FIGS. 20 and 21.

The memory cells which are not yet completely programmed among the selected memory cells at steps S645 and 655 may be program cells. When the second program voltage is applied to the selected memory cells at step S665, the threshold voltage distribution of the memory cells corresponding to the erase state $E_{IS}$ may be changed to the erase state $E_{IS1}$, and the threshold voltage distribution of the memory cells corresponding to the intermediate program state $P_{IS1}$ may be changed to an intermediate program state $P_{IS2}$.

As described above, according to an embodiment, the second program voltage which is applied to the selected word line at step S665 may have substantially the same magnitude as the first program voltage which is applied to the selected word line at step S635. According to another embodiment, the second program voltage which is applied to the selected word line at step S665 may be smaller than the first program voltage which is applied to the selected word line at step S635. When the second program voltage which is applied to the selected word line at step S665 is less than the first program voltage which is applied to the selected word line at step S635, a threshold voltage shift width of the memory cells at step S665 may be smaller than a threshold voltage shift width of the memory cells at step S635.

Referring to FIG. 23, during one program loop, the threshold voltages of the memory cells corresponding to the upper target program states PV4 to PV7 may be increased first, and the threshold voltages of the memory cells corresponding to the upper and lower target program states PV1 to PV7 may then be increased. Therefore, even when the SPO occurs during the plurality of program loops at step S200, the LSB read operation may be performed by searching for an optimal read voltage. More specifically, when the SPO occurs during the plurality of program loops at step S200, the LSB read operation may be performed using the intermediate read voltage $R_{IS}$. When an error correction operation on LSB read data using the intermediate read voltage $R_{IS}$ fails, an LSB read operation may be performed using the fourth read voltage R4. When the error correction operation on the LSB read data using the fourth read voltage R4 fails, the LSB read operation may be repeated by determining an arbitrary read voltage between the intermediate read voltage $R_{IS}$ and the fourth read voltage R4. As shown in FIG. 23, when the fine programming operation of FIG. 22 is performed, memory cells corresponding to the hatched area "A" in FIG. 11 might not occur. Therefore, when the LSB read operation is performed using the plurality of read voltage, the LSB data on the selected memory cells may be likely to be normally read.

Figure 24:
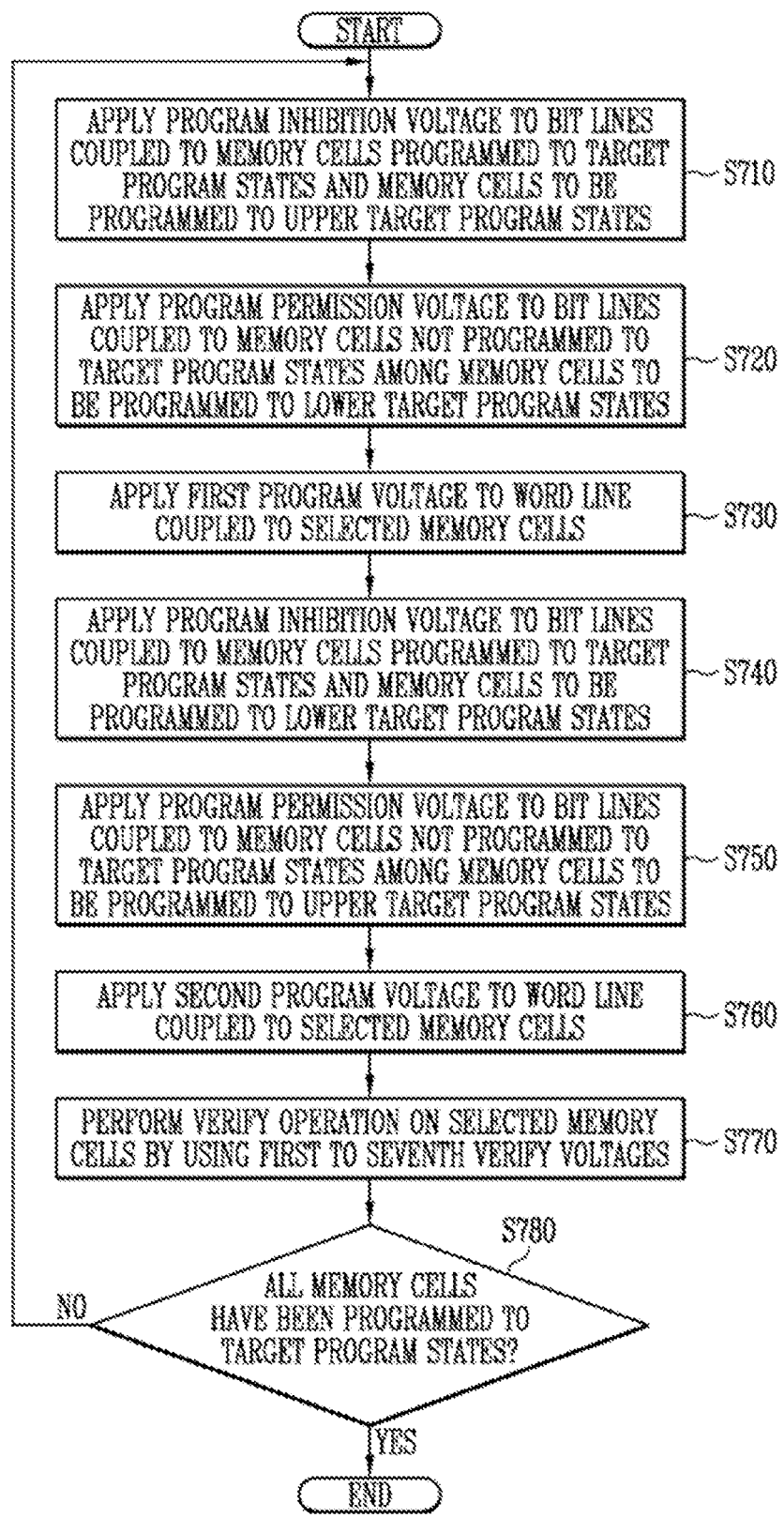
FIG. 24 is a flowchart illustrating another embodiment of step S200 of FIG. 7; C.

FIG. 24 is a flowchart illustrating another embodiment of step S200 of FIG. 7.

Referring to FIG. 24, step S200 of FIG. 7 may include applying a program inhibition voltage to bit lines coupled to memory cells programmed to target program states and memory cells to be programmed to upper target program states (S710), applying a program permission voltage to bit lines coupled to memory cells which are not programmed to the target program states, among memory cells to be programmed to lower target program states (S720), applying a first program voltage to a word line coupled to selected memory cells (S730), applying the program inhibition voltage to the bit lines coupled to the memory cells programmed to the target program states and the memory cells to be programmed to the lower target program states (S740), applying the program permission voltage to the bit line coupled to the memory cells not programmed to the target program states, among the memory cells to be programmed to the upper target program states (S750), applying a second program voltage to the word line coupled to the selected memory cells (S760), performing a verify operation on the selected memory cells using the first to seventh verify voltages (S770), and determining whether all memory cells have been programmed to the target program states (S780).

At step S710, the program inhibition voltage may be applied to the bit lines coupled to the memory cells to be programmed to the upper target program states PV4 to PV7. In addition, the program inhibition voltage may be applied to the bit lines coupled to memory cells which maintain the erase state E at step S710. At step S710, the program inhibition voltage may be applied to the bit lines coupled to the memory cells which are completely programmed, among the memory cells to be programmed to the lower target program states PV1 to PV3, as a result of the verify operation in the previous program loop at step S770.

At step S720, the program inhibition voltage may be applied to the bit lines coupled to memory cells which are not completely programmed among the memory cells to be programmed to the lower target program states PV1 to PV3 as the result of the verify operation in the previous program loop at step S770.

At step S730, the first program voltage may be applied to the selected word line. Therefore, only the threshold voltages of the memory cells which are not completely programmed, among the memory cells to be programmed to the lower target program states PV1 to PV3, may be increased.

At step S740, the program inhibition voltage may be applied to the bit lines coupled to the memory cells to be programmed to the lower target program states PV1 to PV3. In addition, the program inhibition voltage may be applied to the bit lines coupled to the memory cells which maintain the erase state E at step S740. At step S740, the program inhibition voltage may be applied to the bit line coupled to the memory cells which are completely programmed, among the memory cells to be programmed to the upper target program states PV4 to PV7, as the result of the verify operation in the previous program loop at step S770.

At step S750, the program permission voltage may be applied to the bit lines coupled to the memory cells which are not completely programmed, among the memory cells to be programmed to the upper target program states PV4 to PV7, as the result of performing the verify operation in the previous program loop at step S770.

At step S760, the second program voltage may be applied to the selected word line. Therefore, only the threshold voltages of the memory cells which are not completely programmed, among the memory cells to be programmed to the upper target program states PV4 to PV7, may be increased. The second program voltage which is applied to the selected word line at step S760 may be smaller than the first program voltage which is applied to the selected word line at step S730. Therefore, a threshold voltage shift width of the memory cells to be programmed to the upper target program states PV4 to PV7 at step S760 may be greater that of the memory cells to be programmed to the lower target program states PV1 to PV3 at step S370. Therefore, even when the SPO occurs during the plurality of program loops at step S200, the LSB read operation may be performed by searching for an optimal read voltage. More specifically, when the SPO occurs during the plurality of program loops at step S200, the LSB read operation may be performed using the intermediate read voltage $R_{IS}$. When an error correction operation on LSB read data using the intermediate read voltage $R_{IS}$ fails, an LSB read operation may be performed using the fourth read voltage R4. When the error correction operation on the LSB read data using the fourth read voltage R4 fails, the LSB read operation may be repeated by determining an arbitrary read voltage between the intermediate read voltage RIS and the fourth read voltage R4. The threshold voltage shift width of the memory cells to be programmed to the upper target program states PV4 to PV7 may be greater than the threshold voltage shift width of the memory cells to be programmed to the lower target program states PV1 to PV3. Thus, when the fine programming operation of FIG. 24 is performed, memory cells corresponding to the hatched area "A" in FIG. 11 might not occur. Therefore, when the LSB read operation is performed using the plurality of read voltage, the LSB data on the selected memory cells may be likely to be normally read.

At step S770, a verify operation may be performed on the selected memory cells using the first to seventh verify voltages VRF1 to VRF7.

At step S780, it may be determined whether the selected memory cells have been completely programmed to the target program states respectively corresponding thereto. When the threshold voltages of all selected memory cells are greater than the corresponding verify voltages (S780: YES), step S200 may end. When threshold voltages of at least some of the selected memory cells are less than the corresponding verify voltages (S780: NO), the process flow may proceed to step S710, and a subsequent program loop may be repeated.

Figure 25:
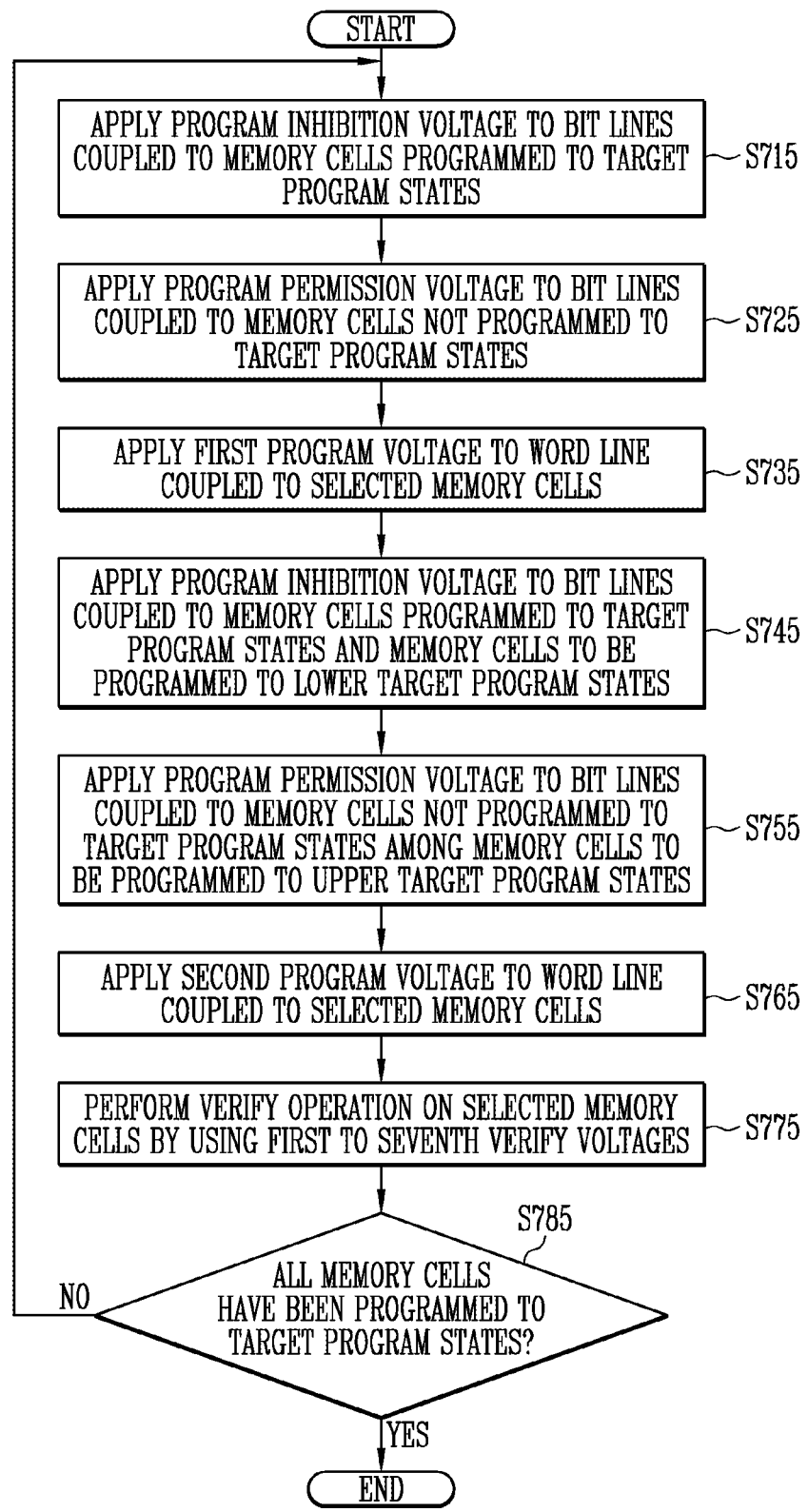
FIG. 25 is a flowchart illustrating another embodiment of step S200 of FIG. 7.

FIG. 25 is a flowchart illustrating another embodiment of step S200 of FIG. 7.

Referring to FIG. 25, step S200 of FIG. 7 may include applying a program inhibition voltage to bit lines coupled to memory cells programmed to target program states (S715), applying a program permission voltage to bit lines coupled to memory cells not programmed to the target program states (S725), applying a first program voltage to a word line coupled to selected memory cells (S735), applying the program inhibition voltage to the bit lines coupled to the memory cells programmed to the target program states and the memory cells to be programmed to the lower target program states (S745), applying the program permission voltage to the bit line coupled to the memory cells not programmed to the target program states, among the memory cells to be programmed to the upper target program states (S755), applying a second program voltage to the word line coupled to the selected memory cells (S765), performing a verify operation on the selected memory cells using the first to seventh verify voltages (S775), and determining whether all memory cells have been programmed to the target program states (S785).

At step S715, a program inhibition voltage may be applied to bit lines coupled to memory cells maintaining the erase state E, and the program inhibition voltage may be applied to bit lines coupled to memory cells which are completely programmed as a result of the verify operation in the previous program loop at step S775.

At step S725, a program permission voltage may be applied to bit lines coupled to memory cells which are not completely programmed as the result of the verify operation in the previous program loop at step S775.

At step S735, the first program voltage may be applied to the selected word line. Only the threshold voltages of the memory cells which are not completely programmed, among the selected memory cells, may be increased.

At step S745, the program inhibition voltage may be applied to the bit lines coupled to the memory cells to be programmed to the lower target program states PV1 to PV3. In addition, the program inhibition voltage may be applied to the bit lines coupled to the memory cells which maintain the erase state E at step S745. At step S745, the program inhibition voltage may be applied to the bit lines coupled to the memory cells which are completely programmed, among the memory cells to be programmed to the upper target program states PV4 to PV7, as the result of the verify operation in the previous program loop at step S775.

At step S755, the program permission voltage may be applied to the bit lines coupled to the memory cells which are not completely programmed, among the memory cells to be programmed to the upper target program states PV4 to PV7, as the result of performing the verify operation in the previous program loop at step S775.

At step S765, the second program voltage may be applied to the selected word line. Therefore, only the threshold voltages of the memory cells which are not completely programmed, among the memory cells to be programmed to the upper target program states PV4 to PV7, may be increased. The second program voltage which is applied to the selected word line at step S765 may be smaller than the first program voltage which is applied to the selected word line at step S735. Therefore, a threshold voltage shift width of the memory cells to be programmed to the upper target program states PV4 to PV7 at step S765 may be greater than that of the memory cells to be programmed to the upper and lower target program states PV1 to PV7 at step S735. Therefore, even when the SPO occurs during the plurality of program loops at step S200, the LSB read operation may be performed by searching for an optimal read voltage. More specifically, when the SPO occurs during the plurality of program loops at step S200, the LSB read operation may be performed using the intermediate read voltage $R_{IS}$. When an error correction operation on LSB read data using the intermediate read voltage $R_{IS}$ fails, an LSB read operation may be performed using the fourth read voltage R4. When the error correction operation on the LSB read data using the fourth read voltage R4 fails, the LSB read operation may be repeated by determining an arbitrary read voltage between the intermediate read voltage $R_{IS}$ and the fourth read voltage R4. Since the threshold voltage shift width of the memory cells to be programmed to the upper target program states PV4 to PV7 at step S765 is greater than the threshold voltage shift width of the memory cells to be programmed to the upper and lower target program states PV1 to PV7, when the fine programming operation of FIG. 25 is performed, memory cells corresponding to the hatched area "A" in FIG. 11 might not occur. Therefore, when the LSB read operation is performed using the plurality of read voltage, the LSB data on the selected memory cells may be likely to be normally read.

At step S775, a verify operation may be performed on the selected memory cells using the first to seventh verify voltages VRF1 to VRF7.

At step S785, it may be determined whether the selected memory cells have been completely programmed to the target program states respectively corresponding thereto. When the threshold voltages of all selected memory cells are greater than the corresponding verify voltages (S785: YES), step S200 may end. When threshold voltages of at least some of the selected memory cells are less than the corresponding verify voltages (S785: NO), the process flow may proceed to step S715, and a subsequent program loop may be repeated.

Figure 26:
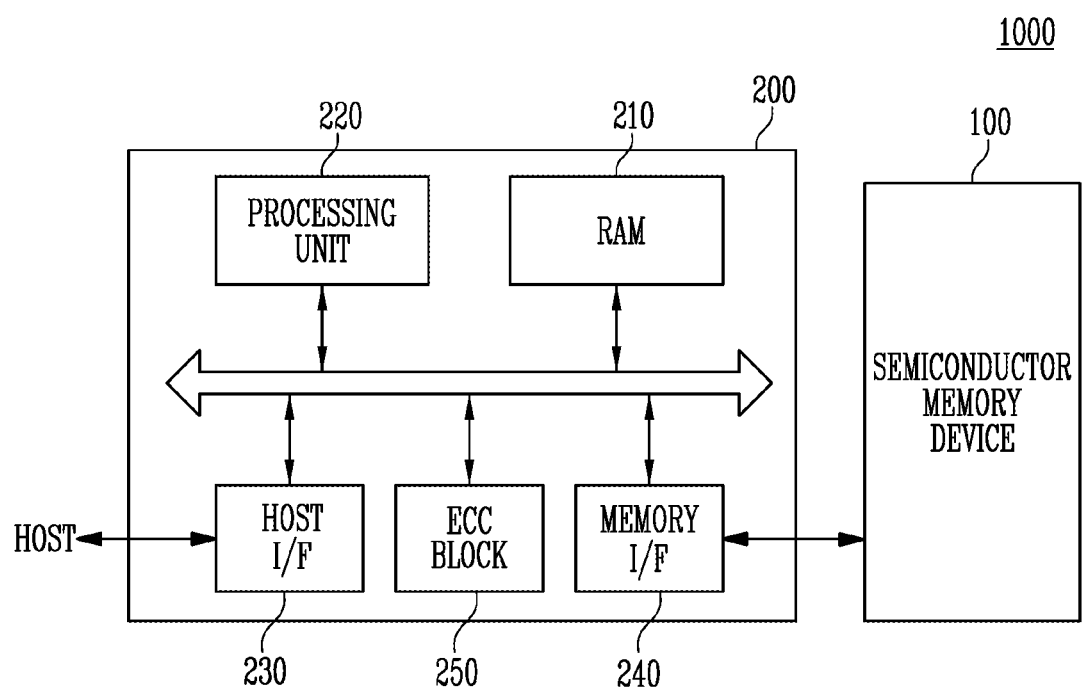
FIG. 26 is a block diagram illustrating an example of a controller shown in FIG. 1.

FIG. 26 is a diagram illustrating an embodiment of the controller 200 of FIG. 1.

Referring to FIG. 26, the controller 200 may be coupled to a host and the semiconductor memory device 100. The semiconductor memory device 100 may be the semiconductor memory device described above with reference to FIG. 2. In an embodiment, the memory system 1000 may include the controller and the semiconductor memory device.

In response to a request from the host, the controller 200 may access the semiconductor memory device 100. For example, the controller 200 may control write, read, erase, and background operations of the semiconductor memory device 100. The controller 200 may provide an interface between the semiconductor memory device 100 and the host. The controller 200 may drive firmware for controlling the semiconductor memory device 100.

The controller 200 may include a random access memory (RAM) 210, a processing unit 220, a host interface 230, a memory interface 240, and an error correction code (ECC) block 250. The RAM 210 may serve as at least one of a working memory, a cache memory between the semiconductor memory device 100 and the host, and a buffer memory between the semiconductor memory device 100 and the host.

The processing unit 220 may control overall operations of the controller 200.

The host interface 230 may include a protocol for exchanging data between the host and the controller 200. According to an embodiment, the controller 200 may communicate with the host through one or more various protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, a private protocol, etc.

The memory interface 240 may interface with the semiconductor memory device 100. For example, the memory interface 240 may include a NAND interface or a NOR interface.

The ECC block 250 may be configured to detect and correct an error in data receive from the semiconductor memory device 100. The processing unit 220 may control the semiconductor memory device 100 to control a read voltage according to an error detection result and perform re-read.

The controller 200 and the semiconductor memory device 100 may be integrated into a single semiconductor device to form a memory card. For example, the controller 200 and the semiconductor memory device 100 may be integrated into a single semiconductor device and form a memory card, such as a personal computer memory card international association (PCMCIA), a compact flash (CF) card, a smart media card (SM or SMC), a memory stick multimedia card (MMC, RS-MMC, or MMCmicro), an SD card (SD, miniSD, microSD, or SDHC), a universal flash storage (UFS), and the like.

The controller 200 and the semiconductor memory device 100 may be integrated into a single semiconductor device to form a solid state drive (SSD). The SSD may include storage device that is configured to store data in a semiconductor memory. When the memory system 1000 serves as the SSD, an operating speed of the host coupled to the memory system 1000 may be remarkably improved.

In another example, the memory system 1000 which includes the controller 200 and the semiconductor memory device 100 may be provided as one of various elements of an electronic device such as a computer, an ultra mobile PC (UMPC), a workstation, a net-book, a personal digital assistant (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

In an embodiment, the semiconductor memory device 100 or the memory system 1000 may be mounted in packages in various forms. For example, the semiconductor memory device 100 or the memory system 1000 may be embedded in packages such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline integrated circuit (SOIC) package, a shrink small outline package (SSOP), a thin small outline package (TSOP), a system in package (SIP), a multichip package (MCP), a wafer-level fabricated package (WFP), a wafer-level processed stack package (WSP), or the like.

Figure 27:
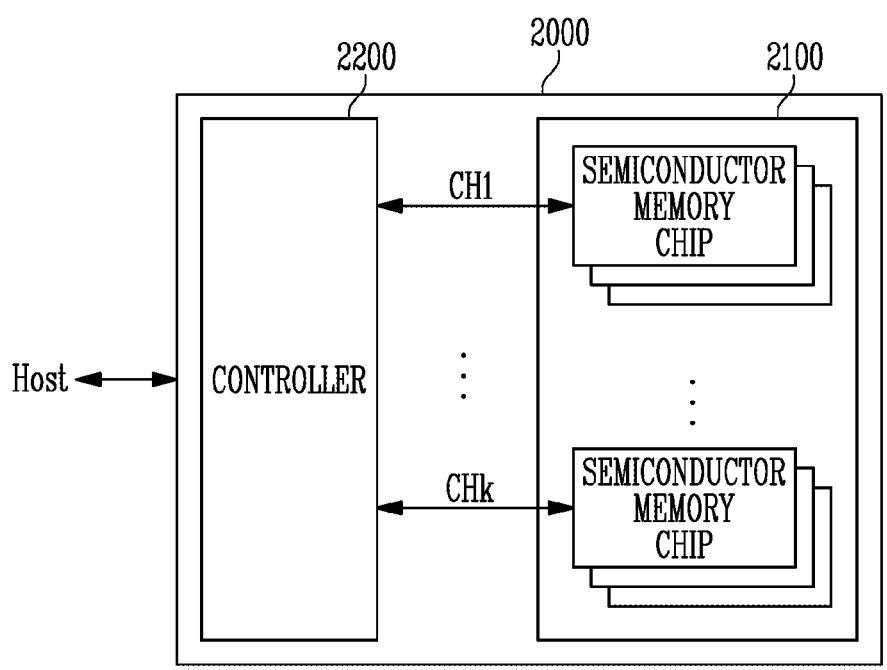
FIG. 27 is a block diagram illustrating an application example of a memory system shown in FIG. 26.

FIG. 27 is a block diagram illustrating an application example of the memory system 1000 of FIG. 26.

Referring to FIG. 27, a memory system 2000 may include a semiconductor memory device 2100 and a controller 2200. The semiconductor memory device 2100 may include semiconductor memory chips. The semiconductor memory chips may be divided into a plurality of groups.

FIG. 27 illustrates the groups communicating with the controller 2200 through first to k-th channels CH1 to CHk. Each of the semiconductor memory chips may be configured and operated in substantially the same manner as the semiconductor memory device 100 described above with reference to FIG. 2.

Each group may communicate with the controller 2200 through a single common channel. The controller 2200 may be configured in substantially the same manner as the controller 200 described with reference to FIG. 26, and configured to control the plurality of memory chips of the semiconductor memory device 2100 through the plurality of channels CH1 to CHk.

Figure 28:
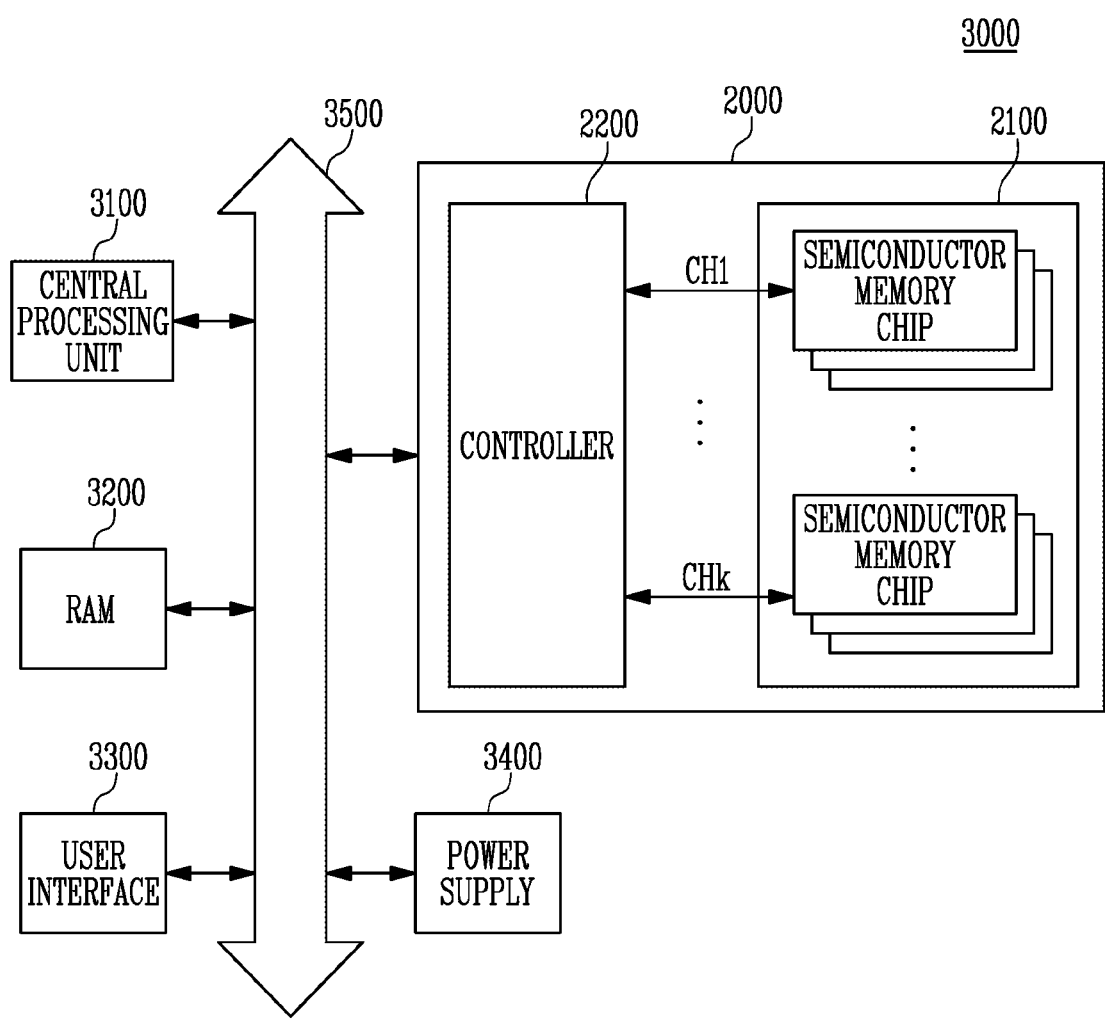
FIG. 28 is a block diagram illustrating a computing system including a memory system described above with reference to FIG. 27.

FIG. 28 is a block diagram illustrating a computing system 3000 including the memory system 2000 described above with reference to FIG. 27.

The computing system 3000 may include a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300 and the power supply 3400 through the system bus 3500. Data provided through the user interface 3300 or processed by the central processing unit 3100 may be stored in the memory system 2000.

As shown in FIG. 28, the semiconductor memory device 2100 may be coupled to the system bus 3500 through the controller 2200. However, the semiconductor memory device 2100 may be directly coupled to the system bus 3500. The central processing unit 3100 and the RAM 3200 may perform functions of the controller 2200.

As illustrated in FIG. 28, the memory system 2000 as described above with reference to FIG. 27 may be provided. However, the memory system 2000 may be replaced by the memory system 1000 including the controller 200 and the semiconductor memory device 100 as described above with reference to FIG. 26.

According to an embodiment of the present disclosure, a semiconductor memory device improving data reliability and an operating method thereof may be provided.

What is claimed is:

1. A method of operating a semiconductor memory device programming selected memory cells to store N bits of data in each of the selected memory cells, the method comprising:
foggy programming for increasing threshold voltages of first memory cells to be programmed to $(2^{N-1})$th to $(2^N-1)$th target program states, among first to $(2^N-1)$th target program states, to an intermediate program state by using an intermediate verify voltage; and
fine programming for programming the selected memory cells to target program states by using first to $(2^N-1)$th verify voltages,
wherein the fine programming comprises increasing the threshold voltages of the first memory cells to be programmed to the $(2^{N-1})$th to $(2^N-1)$th target program states and increasing threshold voltages of second memory cells to be programmed to the first to $(2^{N-1}-1)$th target program states,
wherein the second memory cells are programmed at a different time from the first memory cells,
wherein N is a natural number greater than 1,
wherein when the fine programming of the first memory cells is suspended, a first read operation to resume the fine programming of the first memory cells is performed using a first read voltage between an erase state and the intermediate verify voltage, and
wherein when the fine programming of the second memory cells is suspended, a second read operation to resume the fine programming of the second memory cells is performed using a second read voltage between the threshold voltages of the first memory cells and the threshold voltages of the second memory cells.

2. The method of claim 1, wherein the intermediate verify voltage is smaller than the $(2^{N-1})$th verify voltage.

3. The method of claim 1, wherein the foggy programming comprises:

applying a program inhibition voltage to bit lines coupled to third memory cells programmed to the intermediate program state, among the first memory cells;
applying a program permission voltage to bit lines coupled to fourth memory cells not completely programmed to the intermediate program state, among the first memory cells;
applying a program voltage to a word line coupled to the selected memory cells; and
performing a verify operation on the fourth memory cells by using the intermediate verify voltage.

4. The method of claim 1, wherein the fine programming comprises:
increasing the threshold voltages of the first memory cells to be programmed to the $(2^{N-1})$th to $(2^N-1)$th target program states by using the $(2^{N-1})$th to $(2^N-1)$th verify voltages; and
increasing the threshold voltages of the second memory cells to be programmed to the first to $(2^{N-1}-1)$th target program states by using the first to $(2^{N-1}-1)$th verify voltages after the first memory cells are programmed.

5. The method of claim 4, wherein the increasing of the threshold voltages of the first memory cells to be programmed to the $(2^{N-1})$th to $(2^N-1)$th target program states comprises:
applying a program inhibition voltage to bit lines coupled to memory cells completely programmed to corresponding target program states and second memory cells memory cells corresponding to the first to $(2^{N-1}-1)$th target program states among the selected memory cells;
applying a program permission voltage to bit lines coupled to memory cells not completely programmed among the first memory cells corresponding to the $(2^{N-1})$th to $(2^N-1)$th target program states;
applying a program voltage to a word line coupled to the selected memory cells; and
performing a verify operation on the first memory cells to be programmed to the $(2^{N-1})$th to $(2^N-1)$th target program states by using the $(2^{N-1})$th to $(2^N-1)$th verify voltages.

6. The method of claim 4, wherein the increasing of the threshold voltages of the second memory cells to be programmed to the first to $(2^{N-1}-1)$th target program states comprises:
applying a program inhibition voltage to bit lines coupled to memory cells completely programmed to corresponding target program states and the first memory cells corresponding to the $(2^{N-1})$th to $(2^N-1)$th target program states among the selected memory cells;
applying a program permission voltage to bit lines coupled to memory cells not completely programmed among the second memory cells corresponding to the first to $(2^{N-1}-1)$th target program states;
applying a program voltage to a word line coupled to the selected memory cells; and
performing a verify operation on the second memory cells to be programmed to the first to $(2^{N-1}-1)$th target program states by using the first to $(2^{N-1}-1)$th verify voltages.

7. The method of claim 1, wherein the fine programming comprises:
applying a program inhibition voltage to bit lines coupled to memory cells completely programmed to corresponding target program states and the second memory cells corresponding to the first to $(2^{N-1}-1)$th target program states among the selected memory cells;

applying a program permission voltage to bit lines coupled to memory cells not completely programmed among the first memory cells corresponding to the $(2^{N-1})$th to $(2^N-1)$th target program states;

applying a first program voltage to a word line coupled to the selected memory cells;

applying a program inhibition voltage to bit lines coupled to memory cells completely programmed to corresponding target program states and the first memory cells corresponding to the $(2^{N-1})$th to $(2^N-1)$th target program states among the selected memory cells;

applying a program permission voltage to bit lines coupled to memory cells not completely programmed among the second memory cells corresponding to the first to $(2^{N-1}-1)$th target program states;

applying a second program voltage smaller than the first program voltage to the word line coupled to the selected memory cells; and performing a verify operation on the selected memory cells by using the first to $(2^N-1)$th verify voltages.

8. The method of claim 1, wherein the fine programming comprises:

applying a program inhibition voltage to bit lines coupled to memory cells completely programmed to corresponding target program states and the second memory cells corresponding to the first to $(2^{N-1}-1)$th target program states among the selected memory cells;

applying a program permission voltage to bit lines coupled to memory cells not completely programmed among the first memory cells corresponding to the $(2^{N-1})$th to $(2^N-1)$th target program states;

applying a first program voltage to a word line coupled to the selected memory cells;

applying a program inhibition voltage to bit lines coupled to memory cells completely programmed among the selected memory cells;

applying a program permission voltage to bit lines coupled to memory cells not completely programmed among the selected memory cells;

applying a second program voltage smaller than the first program voltage to the word line coupled to the selected memory cells; and performing a verify operation on the selected memory cells by using the first to $(2^N-1)$th verify voltages.

9. The method of claim 1, wherein N is 3 (three).

10. A method of operating a semiconductor memory device programming selected memory cells to store N bits of data in each of the selected memory cells, the method comprising:

foggy programming for increasing threshold voltages of first memory cells to be programmed to $(2^{N-1})$th to $(2^N-1)$th target program states, among first to $(2^N-1)$th target program states, to an intermediate program state by using an intermediate verify voltage; and fine programming for programming the selected memory cells to target program states by using first to $(2^N-1)$th verify voltages, wherein the fine programming comprises increasing the threshold voltages of second memory cells to be programmed to the first to $(2^{N-1}-1)$th target program states and increasing threshold voltages of the first memory cells to be programmed to the $(2^{N-1})$ to $(2^N-1)$th target program states, wherein the second memory cells are programmed at a different time from the first memory cells, wherein N is a natural number greater than 1, wherein when the fine programming of the first memory cells is suspended, a first read operation to resume the fine programming of the first memory cells is performed using a first read voltage between an erase state and the intermediate verify voltage, and wherein when the fine programming of the second memory cells is suspended, a second read operation to resume the fine programming of the second memory cells is performed using a second read voltage between the threshold voltages of the first memory cells and the threshold voltages of the second memory cells.

11. The method of claim 10, wherein the fine programming comprises:

applying a program inhibition voltage to bit lines coupled to memory cells completely programmed to corresponding target program states and the first memory cells corresponding to the $(2^{N-1})$th to $(2^N-1)$th target program states among the selected memory cells;

applying a program permission voltage to bit lines coupled to memory cells not completely programmed among the second memory cells corresponding to the first to $(2^{N-1}-1)$th target program states after the first memory cells are programmed;

applying a first program voltage to a word line coupled to the selected memory cells;

applying a program inhibition voltage to bit lines coupled to memory cells completely programmed to corresponding target program states and the second memory cells corresponding to the first to $(2^{N-1}-1)$th target program states among the selected memory cells;

applying a program permission voltage to bit lines coupled to memory cells not completely programmed among the first memory cells corresponding to the $(2^{N-1})$th to $(2^N-1)$th target program states;

applying a second program voltage greater than the first program voltage to the word line coupled to the selected memory cells; and performing a verify operation on the selected memory cells by using the first to $(2^N-1)$th verify voltages.

12. The method of claim 10, wherein the fine programming comprises:

applying a program inhibition voltage to bit lines coupled to memory cells completely programmed among the selected memory cells;

applying a program permission voltage to bit lines coupled to memory cells not completely programmed among the selected memory cells;

applying a first program voltage to a word line coupled to the selected memory cells;

applying a program inhibition voltage to bit lines coupled to memory cells completely programmed to corresponding target program states and the second memory cells corresponding to the first to $(2^{N-1}-1)$th target program states among the selected memory cells;

applying a program permission voltage to bit lines coupled to memory cells not completely programmed among the first memory cells corresponding to the $(2^{N-1})$th to $(2^N-1)$th target program states;

applying a second program voltage greater than the first program voltage to the word line coupled to the selected memory cells; and performing a verify operation on the selected memory cells by using the first to $(2^N-1)$th verify voltages.

13. A method of operating a semiconductor memory device programming selected memory cells to store N bits of data in each of the selected memory cells, the method comprising:

foggy programming for increasing threshold voltages of first memory cells to be programmed to $(2^{N-1})$th to $(2^N-1)$th target program states, among first to $(2^N-1)$th target program states, to a first intermediate program state by using an intermediate verify voltage; and fine programming for increasing the threshold voltages of the selected memory cells to be programmed to the first to $(2^N-1)$th target program states by using first to $(2^N-1)$th verify voltages, wherein N is a natural number greater than 1, wherein second memory cells to be programmed to the first to $(2^{N-1})$th target program states are programmed using first to $(2^{N-1})$th verify voltages, and then the first memory cells to be programmed to $(2^{N-1})$th to $(2^N-1)$th target program states are programmed using $(2^{N-1})$th to $(2^N-1)$th verify voltages after the second memory cells are programmed, wherein when the fine programming of the first memory cells is suspended, a first read operation to resume the fine programming of the first memory cells is performed using a first read voltage between an erase state and the intermediate verify voltage, and wherein when the fine programming of the second memory cells is suspended, a second read operation to resume the fine programming of the second memory cells is performed using a second read voltage between the threshold voltages of the first memory cells and the threshold voltages of the second memory cells.

14. The method of claim 13, wherein the foggy programming comprises:

applying a program inhibition voltage to bit lines coupled to third memory cells programmed to the first intermediate program state;

applying a program permission voltage to bit lines coupled to fourth memory cells not completely programmed to the first intermediate program state, among the first memory cells;

applying a program voltage to a word line coupled to the selected memory cells; and performing a verify operation on the fourth memory cells by using the intermediate verify voltage.

15. The method of claim 14, wherein the fine programming of the first memory cells comprises:

applying the program inhibition voltage to bit lines coupled to memory cells completely programmed to corresponding target program states and the second memory cells corresponding to the first to $(2^{N-1}-1)$th target program states among the selected memory cells;

applying the program permission voltage to bit lines coupled to memory cells not completely programmed among the first memory cells corresponding to the $(2^{N-1})$th to $(2^N-1)$th target program states;

applying a program voltage to a word line coupled to the selected memory cells; and performing a verify operation on the first memory cells to be programmed to the $(2^{N-1})$th to $(2^N-1)$th target program states by using the $(2^{N-1})$th to $(2^N-1)$th verify voltages.

16. The method of claim 15, wherein the fine programming of the first memory cells further comprises, after performing the verify operation, determining whether threshold voltages of all of the first memory cells corresponding to the $(2^{N-1})$th to $(2^N-1)$th target program states are greater than the $(2^{N-1})$th verify voltage.

17. The method of claim 16, wherein the fine programming of the first memory cells ends in response to determination that threshold voltages of all of the first memory cells corresponding to the $(2^{N-1})$th to $(2^N-1)$th target program states are greater than the $(2^{N-1})$th verify voltage.

18. The method of claim 16, wherein in response to determination that at least one of the threshold voltages of the first memory cells corresponding to the $(2^{N-1})$th to $(2^N-1)$th target program states is smaller than the $(2^{N-1})$th verify voltage, the second foggy programming repeats:

applying the program inhibition voltage to the bit lines coupled to the memory cells completely programmed to the corresponding target program states and the second memory cells corresponding to the first to $(2^{N-1}-1)$th target program states among the selected memory cells;

applying the program permission voltage to the bit lines coupled to the memory cells not completely programmed among the first memory cells corresponding to the $(2^{N-1})$th to $(2^N-1)$th target program states;

applying the program voltage to the word line coupled to the selected memory cells; and performing the verify operation on the first memory cells to be programmed to the $(2^{N-1})$th to $(2^N-1)$th target program states by using the $(2^{N-1})$th to $(2^N-1)$th verify voltages.

19. The method of claim 13, wherein the fine programming of the second memory cells comprises:

applying a program inhibition voltage to bit lines coupled to memory cells completely programmed to corresponding target program states among the selected memory cells;

applying a program permission voltage to bit lines coupled to memory cells not completely programmed to the corresponding target program states among the selected memory cells;

applying a program voltage to a word line coupled to the selected memory cells; and performing a verify operation on the selected memory cells by using the first to $(2^{N-1})$th verify voltages.

20. The method of claim 13, wherein the intermediate verify voltage is smaller than the $(2N^{-1})$th verify voltage.

* * * * *